(12) United States Patent
Lohwasser et al.

(10) Patent No.: US 11,475,906 B2
(45) Date of Patent: *Oct. 18, 2022

(54) RESAMPLING OUTPUT SIGNALS OF QMF BASED AUDIO CODEC

(71) Applicant: Fraunhofer-Gesellschaft zur Foerderung der angewandten Forschung e.V., Munich (DE)

(72) Inventors: Markus Lohwasser, Hersbruck (DE); Manuel Jander, Erlangen (DE); Max Neuendorf, Nuremberg (DE); Ralf Geiger, Erlangen (DE); Markus Schnell, Nuremberg (DE); Matthias Hildenbrand, Erlangen (DE); Tobias Chalupka, Heroldsberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/737,935

(22) Filed: May 5, 2022

(65) Prior Publication Data

US 2022/0262381 A1  Aug. 18, 2022

Related U.S. Application Data

(63) Continuation of application No. 16/398,669, filed on Apr. 30, 2019, now Pat. No. 11,361,779, which is a
(Continued)

(51) Int. Cl.
*G10L 19/24* (2013.01)
*G10L 19/16* (2013.01)
(Continued)

(52) U.S. Cl.
CPC ............ *G10L 19/24* (2013.01); *G10L 19/008* (2013.01); *G10L 19/0204* (2013.01);
(Continued)

(58) Field of Classification Search
CPC . G10L 19/0002; G10L 19/0208; G10L 19/16; G10L 19/24; G10L 21/00; G10L 21/04
See application file for complete search history.

(56) References Cited

U.S. PATENT DOCUMENTS 6,370,507 B1  4/2002 Grill et al.
6,925,116 B2  8/2005 Liljeryd et al.
(Continued)

FOREIGN PATENT DOCUMENTS

CN  101069233 A  11/2007
CN  1010501760  8/2009
(Continued)

OTHER PUBLICATIONS

4FRONT Technologies, "SNDCTL_DSP_SPEED", OSS v2.x API Reference—Set the Sampling Rate Web Link. http://manuals.opensound.com/develper/SNDCTL_DSP_SPEED.htmlAccessed online: Jan. 2, 2013. , 2013.
(Continued)

*Primary Examiner* — Paras D Shah
(74) *Attorney, Agent, or Firm* — Perkins Coie LLP; Michael A. Glenn

(57) ABSTRACT

An apparatus for processing an audio signal includes a configurable first audio signal processor for processing the audio signal in accordance with different configuration settings to obtain a processed audio signal, wherein the apparatus is adapted so that different configuration settings result in different sampling rates of the processed audio signal. The apparatus furthermore includes n analysis filter bank having a first number of analysis filter bank channels, a synthesis
(Continued)

filter bank having a second number of synthesis filter bank channels, a second audio processor being adapted to receive and process an audio signal having a predetermined sampling rate, and a controller for controlling the first number of analysis filter bank channels or the second number of synthesis filter bank channels in accordance with a configuration setting.

13 Claims, 18 Drawing Sheets

Related U.S. Application Data continuation of application No. 15/424,625, filed on Feb. 3, 2017, now Pat. No. 10,311,886, which is a continuation of application No. 13/762,614, filed on Feb. 8, 2013, now Pat. No. 9,595,265, which is a continuation of application No. PCT/EP2011/063848, filed on Aug. 11, 2011.

(60) Provisional application No. 61/373,126, filed on Aug. 12, 2010.

(51) Int. Cl.
G10L 19/02 (2013.01)
G10L 19/26 (2013.01)
G10L 19/008 (2013.01)

(52) U.S. Cl.
CPC .............. *G10L 19/16* (2013.01); *G10L 19/26* (2013.01); *G10L 19/02* (2013.01)

(56) References Cited

U.S. PATENT DOCUMENTS

| | | |
|---|---|---|
| 6,940,973 B1 | 9/2005 | Yeap et al. |
| 7,110,554 B2 | 9/2006 | Brennan et al. |
| RE40,281 E | 4/2008 | Tzannes et al. |
| 7,391,870 B2 | 6/2008 | Herre et al. |
| 7,451,091 B2 | 11/2008 | Chong et al. |
| 7,483,758 B2 | 1/2009 | Liljeryd et al. |
| 7,487,097 B2 | 2/2009 | Engdegard et al. |
| 8,073,685 B2 | 12/2011 | Villemoes et al. |
| 8,255,231 B2 | 8/2012 | Villemoes et al. |
| 8,321,229 B2 | 11/2012 | Choo et al. |
| 8,392,200 B2 | 3/2013 | Chivukula et al. |
| 2003/0093271 A1 | 5/2003 | Tsushima et al. |
| 2005/0018796 A1 | 1/2005 | Sande et al. |
| 2005/0108002 A1 | 5/2005 | Nagai et al. |
| 2005/0149339 A1 | 7/2005 | Tanaka et al. |
| 2005/0216262 A1 | 9/2005 | Fejzo |
| 2006/0271355 A1 | 11/2006 | Wang et al. |
| 2007/0011000 A1 | 1/2007 | Liebchen |
| 2007/0071277 A1 | 3/2007 | Van et al. |
| 2008/0071528 A1 | 3/2008 | Ubale et al. |
| 2008/0097764 A1 | 4/2008 | Grill et al. |
| 2008/0249765 A1 | 10/2008 | Schuijers |
| 2009/0018753 A1 | 1/2009 | Muller |
| 2009/0094038 A1 | 4/2009 | Chivukula et al. |
| 2009/0198753 A1 | 8/2009 | Benjelloun |
| 2011/0007918 A1 | 1/2011 | Baeuml et al. |
| 2011/0202353 A1 | 8/2011 | Neuendorf et al. |
| 2011/0302230 A1 | 12/2011 | Ekstrand et al. |
| 2012/0065983 A1 | 3/2012 | Ekstrand et al. |
| 2013/0010877 A1 | 1/2013 | Heiman et al. |

FOREIGN PATENT DOCUMENTS

| | | |
|---|---|---|
| EP | 1298643 A1 | 4/2003 |
| EP | 2045801 A1 | 4/2009 |
| EP | 2172931 A1 | 4/2010 |
| JP | 2005107255 A | 4/2005 |
| KR | 1020050122267 A | 12/2005 |
| KR | 1020070085681 A | 8/2007 |
| KR | 1020100038455 A | 4/2010 |
| WO | 9857436 A2 | 12/1998 |

OTHER PUBLICATIONS

Argenti, F, et al. , "Design of Cosine-Modulated Filterbanks for Partial Spectrum Reconstruction", Signal Processing 82. , 389-405.
Breebaart, J, et al. , "The Reference Model Architecture for MPEG Spatial Audio Coding", Presented at the 118th AES Convention. Barcelona, Spain. May 28-31. , 1-13.
Cocchi, Gianandrea, et al. , "Subband neural neworks prediction for on-line audio signal recovery", Neural Networks, IEEE Transactions on 13.4 (2002): 867-876.
Multrus, M, et al. , "Finalization of USAC CE on Enhanced Performance at Mid-Bitrates", International Organisation for Standardisation Organisation Internationale De Normalisation. ISO/IEC JTC1/SC29/WG11. Coding of Moving Pictures and Audio. Daegu, Korea. , 44 Pages.
Rao, et al., "Information compression techniques for digital broadcasting and internet", First edition; Kyoritsu Shuppan Co. Ltd.; first impression; , Jun. 10, 1999 , pp. 87-89.

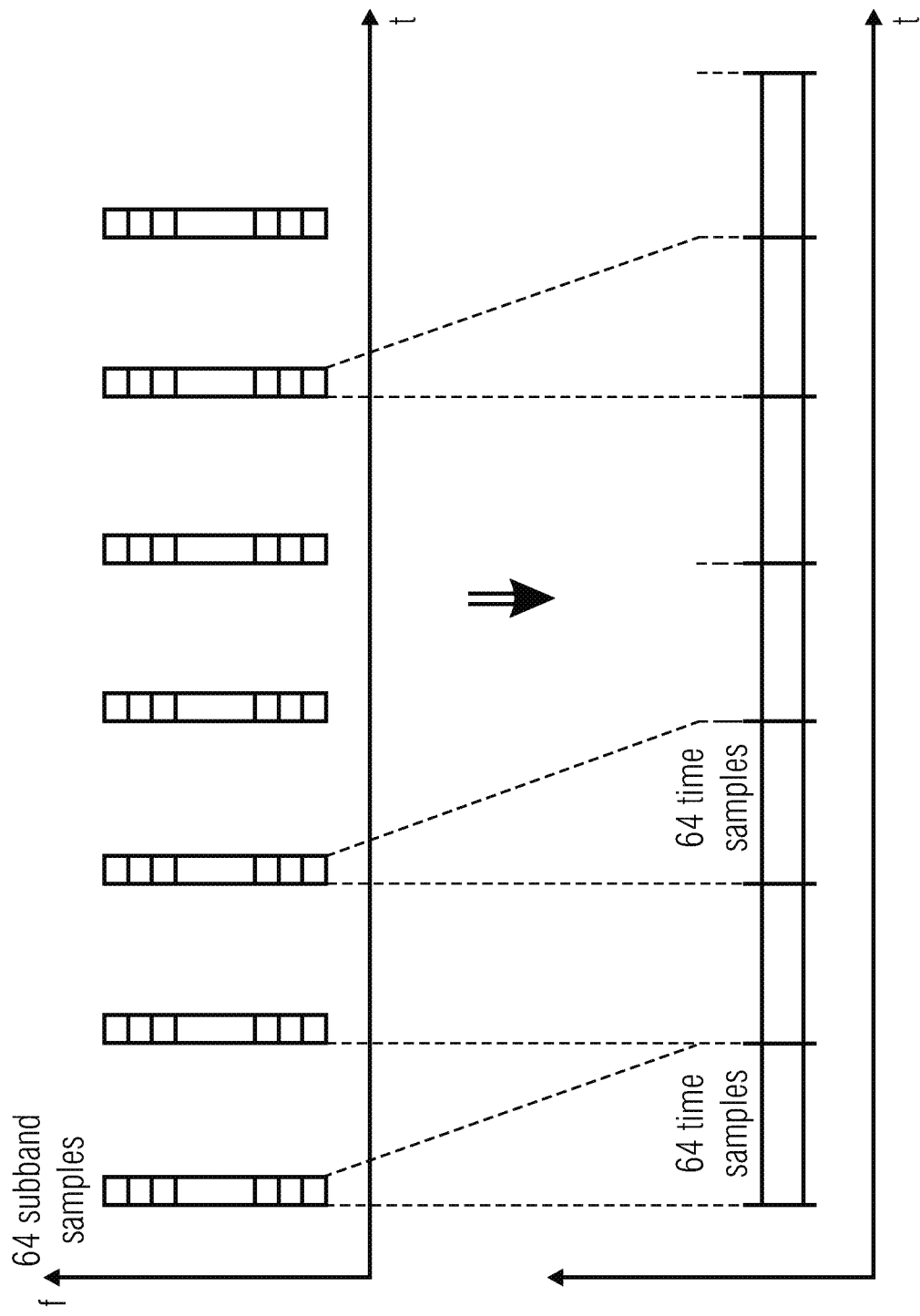

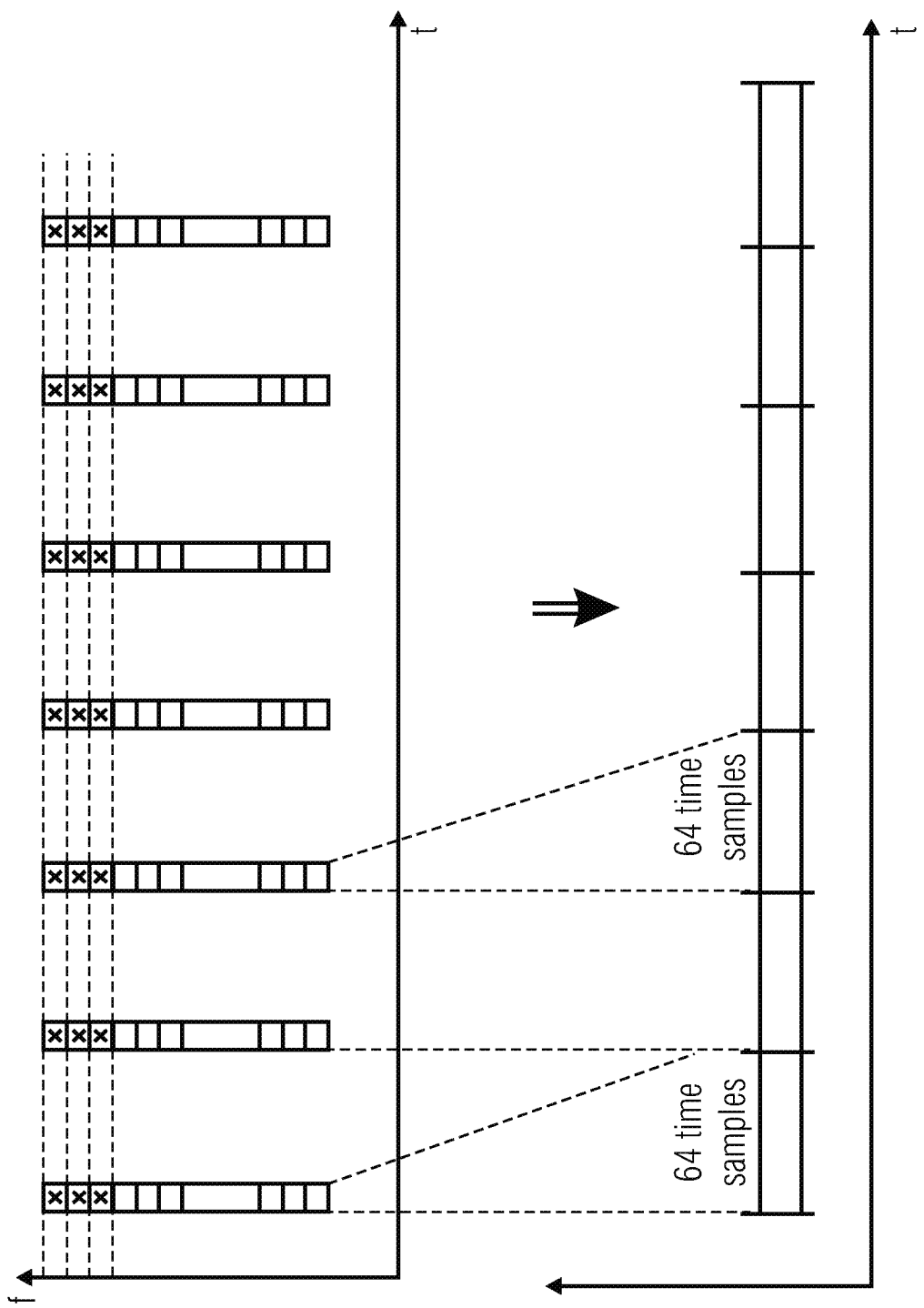

| index | sampling rate 1 |
|---|---|
| 0 | 16 000 Hz |
| 1 | 48 000 Hz |
| 2 | 22 050 Hz |
| ... | ... |

FIG 7A

| index | sampling rate 1 | sampling rate 2 |
|---|---|---|
| 0 | 9 600 Hz | 24 000 Hz |
| 1 | 16 000 Hz | 24 000 Hz |
| 2 | 22 050 Hz | 96 000 Hz |
| ... | ... | ... |

FIG 7B

RESAMPLING OUTPUT SIGNALS OF QMF BASED AUDIO CODEC

CROSS-REFERENCE TO RELATED APPLICATIONS

This application is a continuation of copending U.S. application Ser. No. 16/398,669, filed Apr. 30, 2019, which is a continuation of U.S. application Ser. No. 15/424,625, filed Feb. 3, 2017, now U.S. Pat. No. 10,311,886, issued Jun. 4, 2019, which is a continuation of U.S. application Ser. No. 13/762,614, filed Feb. 8, 2013, now U.S. Pat. No. 9,595,265, issued Mar. 14, 2017, which is a continuation of International Application No. PCT/EP2011/063848, filed Aug. 11, 2011, which claims priority from U.S. Provisional Application No. 61/373,126, filed Aug. 12, 2010, which are each incorporated herein in its entirety by this reference thereto.

The present invention relates to audio processing and, in particular to an apparatus and method for resampling output signals of QMF based audio codecs.

BACKGROUND OF THE INVENTION

Most low end audio consumer electronics use digital to analogue converters with fixed sampling rates because of cost reasons. But when multimedia enabled devices may be used in order to support different kinds of audio sources, the process of resampling is unavoidable, because media files might be encoded using different sampling rates, and also communication codecs use different sampling rates. Choosing different sample rates is an important matter in regard to the operating points of different audio codecs and processing methods. The more different sample rates that need to be supported, the more complex is the sample rate adaption and resampling task.

For example in the current MPEG-D USAC (USAC=Unified Speech and Audio Coding) reference model, some uncommon (not an integer multiple of 16000 Hz or 22050 Hz) sampling rates are employed. These rates are the result of a compromise between two aspects: First, a nominal sampling rate of the integrated ACELP coding tool to which it was specifically designed and which, to a degree, dictates the overall system sampling rate, and second, the desire to increase the sampling rate together with bit rate to be able to code greater audio bandwidth and/or to realize scalability.

Partly, the uncommon sampling rates are also a legacy from the AMR-WB+ system which parts of the reference model have been deduced from. Also, as common in practice in low bit rate audio coding, the sampling rate and thus the audio bandwidth are being greatly reduced at low bit rate USAC operating points.

At low USAC bit rates in particular the currently employed sampling rates exhibit both of the above mentioned problems. They are not compatible with low-cost hardware D/A converters and would involve an additional post-resampling step. Audio bandwidth is limited to the Nyquist frequency, which is well below the upper limit of the human audible range.

To adapt the output sampling rate of an audio processing unit, additional resampling functional modules are being used for this purpose, requiring a significant amount of additional computational resources. The technology used for this purpose has not changed in a lot of time, consisting basically of an interpolator and optional up sampler and down sampler modules.

SUMMARY

According to an embodiment, an apparatus for processing an audio signal may have: a configurable first audio signal processor for processing the audio signal in accordance with different configuration settings to acquire a processed audio signal, wherein the apparatus is adapted so that different configuration settings result in different sampling rates of the processed audio signal, an analysis filter bank having a first number of analysis filter bank channels, a synthesis filter bank having a second number of synthesis filter bank channels, a second audio processor being adapted to receive and process an audio signal having a predetermined sampling rate, and a controller for controlling the first number of analysis filter bank channels and the second number of synthesis filter bank channels in accordance with a configuration setting provided to the configurable first audio signal processor, so that an audio signal output of the synthesis filter bank has the predetermined sampling rate or a sampling rate being different from the predetermined sampling rate and being closer to the predetermined sampling rate than a sampling rate of an analysis filter bank input signal.

According to another embodiment, an apparatus for upmixing a surround signal may have: an analysis filter bank for transforming a downmixed time domain signal into a time-frequency domain to generate a plurality of downmixed subband signals, at least two upmix units for upmixing the plurality of subband signals to acquire a plurality of surround subband signals, at least two signal adjuster units for adjusting the number of surround subband signals, wherein the at least two signal adjuster units are adapted to receive a first plurality of input surround subband signals, wherein the at least two signal adjuster units are adapted to output a second plurality of output surround subband signals, and wherein the number of the first plurality of input surround subband signals and the number of the second plurality of output surround subband signals is different, a plurality of synthesis filter bank units for transforming a plurality of output surround subband signals from a time-frequency domain to a time domain to acquire time domain surround output signals, and a controller being adapted to receive a configuration setting and being adapted to control the number of channels of the analysis filter bank, to control the number of channels of the synthesis filter bank units, to control the number of the first plurality of input surround subband signals of the signal adjuster units, and to control the number of the second plurality of output surround subband signals of the signal adjuster units based on the received configuration setting.

According to another embodiment, a method for processing an audio signal may have the steps of: processing an audio signal in accordance with different configuration settings to acquire a first processed audio signal, so that different configuration settings result in different sampling rates of the first processed audio signal, controlling a first number of analysis filter bank channels of an analysis filter bank and a second number of synthesis filter bank channels of a synthesis filter bank in accordance with a configuration setting, so that an audio signal output by the synthesis filter bank has the predetermined sampling rate or a sampling rate being different from the predetermined sampling rate and being closer to the predetermined sampling rate than the sampling rate of an input signal into the analysis filter bank, and processing the audio signal output having the predetermined sampling rate.

Another embodiment may have a computer program for performing the method for processing an audio signal, which method may have the steps of: processing an audio signal in accordance with different configuration settings to acquire a first processed audio signal, so that different configuration settings result in different sampling rates of the first processed audio signal, controlling a first number of analysis filter bank channels of an analysis filter bank and a second number of synthesis filter bank channels of a synthesis filter bank in accordance with a configuration setting, so that an audio signal output by the synthesis filter bank has the predetermined sampling rate or a sampling rate being different from the predetermined sampling rate and being closer to the predetermined sampling rate than the sampling rate of an input signal into the analysis filter bank, and processing the audio signal output having the predetermined sampling rate, when the computer program is executed by a computer or processor.

The present invention is based on the finding that by varying the frequency domain representation signal bandwidth, the equivalent resulting time domain signal will have a different sampling rate as in the case if no bandwidth change would have been done in frequency domain. The operation of bandwidth change is cheap, since it can be accomplished by deleting or adding frequency domain data.

The conversion step from frequency domain back to time domain may be modified in order to be able to handle the different frequency domain bandwidth (transform length).

The modified bandwidth frequency domain signal representation can also be extended to the whole signal processing method instead of being limited to the filter bank, thus allowing the whole process take advantage of the actual target output signal characteristics.

Even if not all audio signal sources can be brought to one single output sample rate, reducing the amount of different output sample rates already saves a lot of computational resources on a given device.

The complexity of a filter bank is directly related to its length. If a filter bank time domain signal synthesis transform is modified for down sampling by reducing the transform length, its complexity will decrease. If it is used for up sampling by enlarging its transform length its complexity will increase, but still far below the complexity that may be useful for an additional resampler with equivalent signal distortion characteristics. Also the signal distortion in total will be less, since any additional signal distortion caused by an additional resampler will be eliminated.

According to an embodiment, the analysis filter bank is adapted to transform the analysis filter bank input signal being represented in a time domain into a first time-frequency domain audio signal having a plurality of first subband signals, wherein the number of first subband signals is equal to the first number of analysis filter bank channels. According to this embodiment, the apparatus further comprises a signal adjuster being adapted to generate a second time-frequency domain audio signal having a plurality of second subband signals from the first time-frequency-domain audio signal based on the configuration setting (conf), such that the number of second subband signals of the second time-frequency domain audio signal is equal to the number of synthesis filter bank channels. The number of second subband signals of the second time-frequency domain audio signal is different from the number of subband signals of the first time-frequency domain audio signal. Furthermore, the synthesis filter bank is adapted to transform the second time-frequency domain audio signal into a time domain audio signal as the audio signal output of the synthesis filter bank.

In another embodiment, the signal adjuster may be adapted to generate the second time-frequency domain audio signal by generating at least one additional subband signal. In a further embodiment, the signal adjuster is adapted to generate at least one additional subband signal by conducting spectral band replication to generate at least one additional subband signal. In another embodiment, the signal adjuster is adapted to generate a zero signal as an additional subband signal.

According to an embodiment, the analysis filter bank is a QMF (Quadrature Mirror Filter) analysis filter bank and the synthesis filter bank is a QMF synthesis filter bank. In an alternative embodiment, the analysis filter bank is an MDCT (Modified Discrete Cosine Transform) analysis filter bank and the synthesis filter bank is an MDCT synthesis filter bank.

In an embodiment, the apparatus may comprise an additional resampler being adapted to receive a synthesis filter bank output signal having a first synthesis sampling rate. The additional resampler may resample the synthesis filter bank output signal to receive a resampled output signal having a second synthesis sampling rate. By combing the apparatus according to an embodiment and an additional resampler it is possible to decrease the complexity of the employed resampler. Instead of employing a high-complexity resampler, two low-complexity resampler may be employed.

In another embodiment, the apparatus may be adapted to feed a synthesis filter bank output signal having a first synthesis sampling rate into the analysis filter bank as an analysis filter bank input signal. By this, again, the complexity of the apparatus according to an embodiment may be reduced. Instead of employing an analysis filter bank and a synthesis filter bank having a huge number of analysis and synthesis filterbank channels, the number of filter bank channels will be significantly reduced. This is achieved by repeating the analysis and synthesis transformations one or more times. According to an embodiment, the analysis and synthesis filter banks may be adapted such that the number of analysis and synthesis filter bank channels may be changeable for each transformation cycle (one transformation cycle comprises an analysis step and a synthesis step).

The controller may be adapted to receive a configuration setting comprising an index number. Furthermore, the controller may then be adapted to determine the sampling rate of the processed audio signal or the predetermined sampling rate based on the index number and a lookup table. According to these embodiments, it is not necessary to transmit the explicit numbers of analysis and synthesis filter bank channels in each configuration setting, but instead, a single index number identifying the particular configuration is transmitted. This reduces the bit rate needed for transmitting a configuration setting.

According to an embodiment, the controller is adapted to determine the first number of analysis filter bank channels or the second number of synthesis filter bank channels based on a tolerable error. In an embodiment, the controller may comprise an error comparator for comparing the actual error with a tolerable error. Furthermore, the apparatus may be adapted to obtain the tolerable error from the configuration setting. According to these embodiments, it may be possible to specify the degree of accuracy of the resampling. It may be appreciated that in certain situations, the accuracy of the resampling can be reduced to also reduce on the other hand the complexity of the analysis and synthesis filter bank and thus to reduce the complexity of the calculation.

According to another embodiment, an apparatus for upmixing a surround signal is provided. The apparatus comprises an analysis filter bank for transforming a downmixed time domain signal into a time-frequency domain to generate a plurality of downmixed subband signals. Moreover, the apparatus comprises at least two upmix units for upmixing the plurality of subband signals to obtain a plurality of surround subband signals. Furthermore, the apparatus comprises at least two signal adjuster units for adjusting the number of surround subband signals. The at least two signal adjuster units are adapted to receive a first plurality of input surround subband signals. The at least two signal adjuster units are adapted to output a second plurality of output surround subband signals, and wherein the number of the first plurality of input surround subband signals and the number of the second plurality of output surround subband signals is different. Moreover, the apparatus comprises a plurality of synthesis filter bank units for transforming a plurality of output surround subband signals from a time-frequency domain to a time domain to obtain time domain surround output signals. Furthermore, the apparatus comprises a controller which is adapted to receive a configuration setting. The controller is moreover adapted to control the number of channels of the analysis filter bank, to control the number of channels of the synthesis filter bank units, to control the number of the first plurality of input surround subband signals of the signal adjuster units, and to control the number of the second plurality of output surround subband signals of the signal adjuster units based on the received configuration setting.

BRIEF DESCRIPTION OF THE DRAWINGS

Embodiments of the present invention will be detailed subsequently referring to the appended drawings, in which:

FIGS. 7a-7b show lookup tables in accordance with an embodiment.

DETAILED DESCRIPTION OF THE INVENTION

Figure 1:
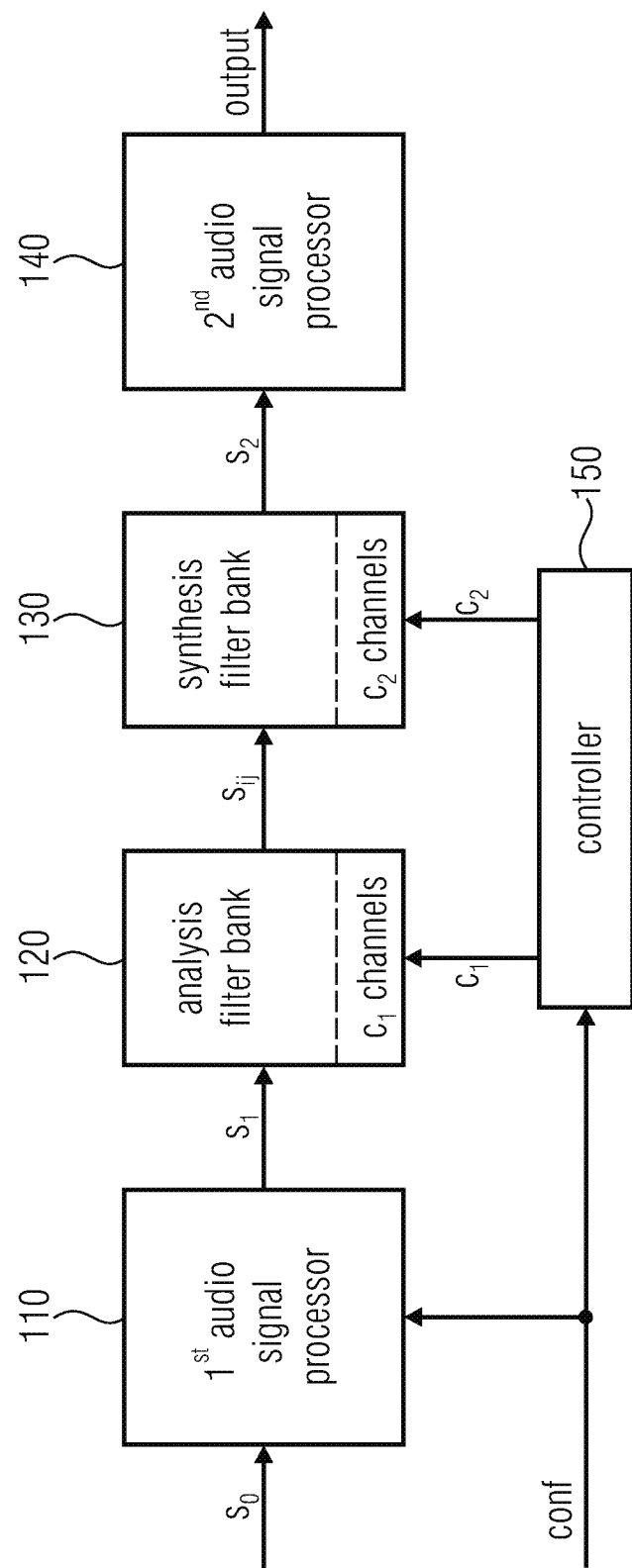
FIG. 1 illustrates an apparatus for processing an audio signal according to an embodiment.

FIG. 1 illustrates an apparatus for processing an audio signal according to an embodiment. An audio signal $s_0$ is fed into the apparatus. In another embodiment, $s_0$ may be a bit stream, in particular an audio data bit stream. Moreover, the apparatus receives a configuration setting conf. The apparatus comprises a configurable first audio signal processor 110 for processing the audio signal $s_0$ in accordance with the configuration setting conf to obtain a processed audio signal $s_1$. Furthermore, the apparatus for processing an audio signal is adapted so that different configuration settings conf result in different sampling rates of the processed audio signal. The apparatus furthermore comprises an analysis filter bank 120 having a first number of analysis filter bank channels $c_1$ and a synthesis filter bank 130 having a second number of synthesis filter bank channels $c_2$. Moreover, the apparatus comprises a second audio processor 140 being adapted to receive and process an audio signal $s_2$ having a predetermined sampling rate. Furthermore, the apparatus comprises a controller 150 for controlling the first number of analysis filter bank channels $c_1$ or the second number of synthesis filter bank channels $c_2$ in accordance with a configuration setting conf provided to the configurable first audio signal processor 110, so that an audio signal output $s_2$ by the synthesis filter bank 130 has the predetermined sampling rate or a sampling rate being different from the predetermined sampling rate, but which is closer to the predetermined sampling rate than the sampling rate of an input signal $s_1$ into the analysis filter bank 120.

The analysis filter bank and the synthesis filter bank might be adapted such that the number of analysis channels and the number of synthesis channels are configurable and that their number might be determined by configurable parameters.

Figure 2A:
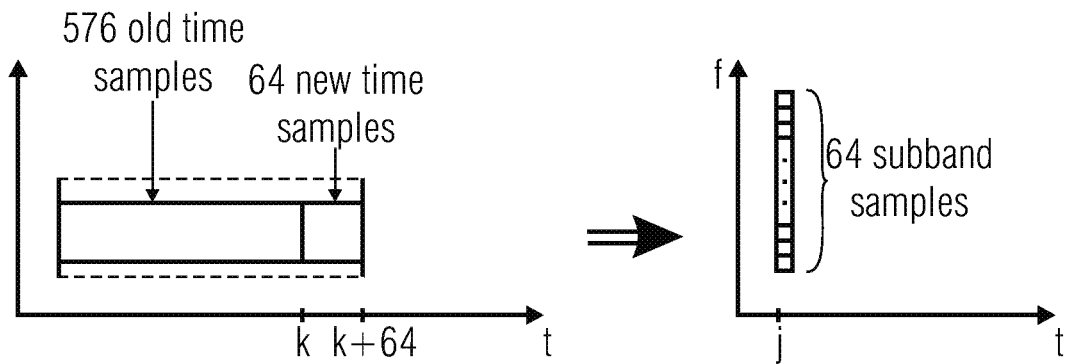
FIGS. 2a-2c depict the transformation of time domain samples into time-frequency domain samples.
Figure 2B:
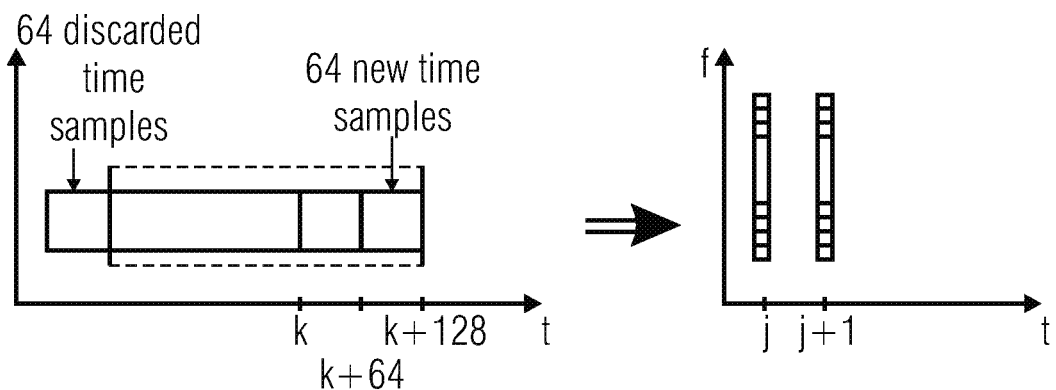
Figure 2C:
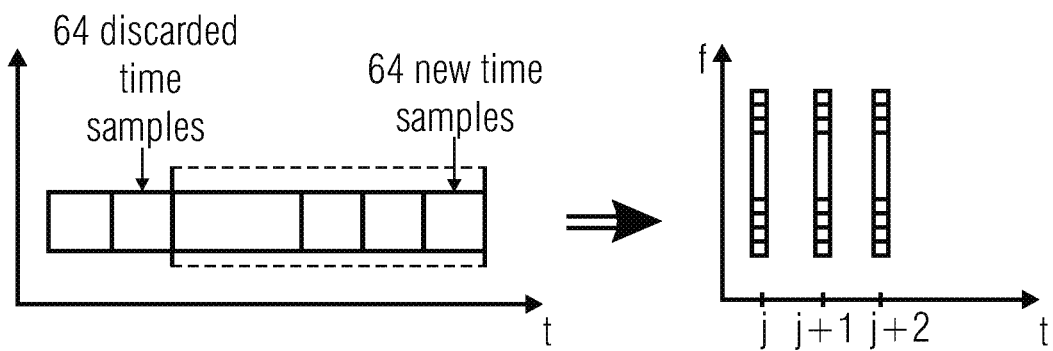

In FIGS. 2a-2c, the transformation of time domain samples into time-frequency domain samples is illustrated. The left side of FIG. 2a illustrates a plurality of samples of a (processed) audio signal in a time domain. On the left side of FIG. 2a, 640 time samples are illustrated (the latest 64 time samples are referred to as "new time samples" while the remaining 576 time samples are referred to as old time samples. In the embodiment depicted by FIG. 2a, a first step of a Short Time Fourier Transform (STFT) is conducted. The 576 old time samples and the 64 new time samples are transformed to 64 frequency values, i.e. 64 subband sample values are generated.

In a subsequent step illustrated in FIG. 2b, the oldest 64 time samples of the considered 640 time samples are discarded. Instead, 64 new time samples are considered together with the remaining 576 already considered time samples available in the processing step illustrated by FIG. 2a. This could be regarded as shifting a sliding window having a length of 640 time samples by 64 time samples in each processing step. Again, also in the processing step depicted in FIG. 2b, further 64 subband samples are generated from the considered 640 time samples (576 old time samples and 64 new time samples considered for the first time). By this, a second set of 64 subband values is generated. One could say that 64 new subband samples are generated by taking 64 new time samples into account.

In the subsequent step depicted in FIG. 2c, again, the sliding window is shifted by 64 time samples, i.e. the oldest 64 time values are discarded and 64 new time samples are taken into account. 64 new subband samples are generated based on the 576 old time samples and 64 new time samples. As can been seen in FIG. 2c, right side, a new set of 64 new subband values has been generated by conducting STFT.

The process illustrated in FIGS. 2a-2c is conducted repeatedly to generate additional subband samples from additional time samples.

Explained in general terms, 64 new time samples are needed to generate 64 new subband samples.

In the embodiment illustrated by FIGS. 2a-2c, each set of the generated subband samples represents the subband samples at a particular time index in a time-frequency domain. I.e., the $32^{nd}$ subband sample of time index j represents a signal sample S[32,j] in a time-frequency domain. Regarding a certain time index in the time-frequency domain, 64 subband values exist for that time index, while for each point-in-time in the time domain, at most a single signal value exist. On the other hand, the sampling rate of each of the 64 frequency bands is only ¹⁄₆₄ of the signal in the time-domain.

It is understood by a person skilled in the art that the number of subband signals, which are generated by an analysis filter bank depends on the number of channels of the analysis filter bank. For example, the analysis filter bank might comprise 16, 32, 96 or 128 channels, such that 16, 32, 96, or 128 subband signals in a time frequency domain might be generated from e.g. 16, 32, 96 or 128 time samples, respectively.

Figure 3A:
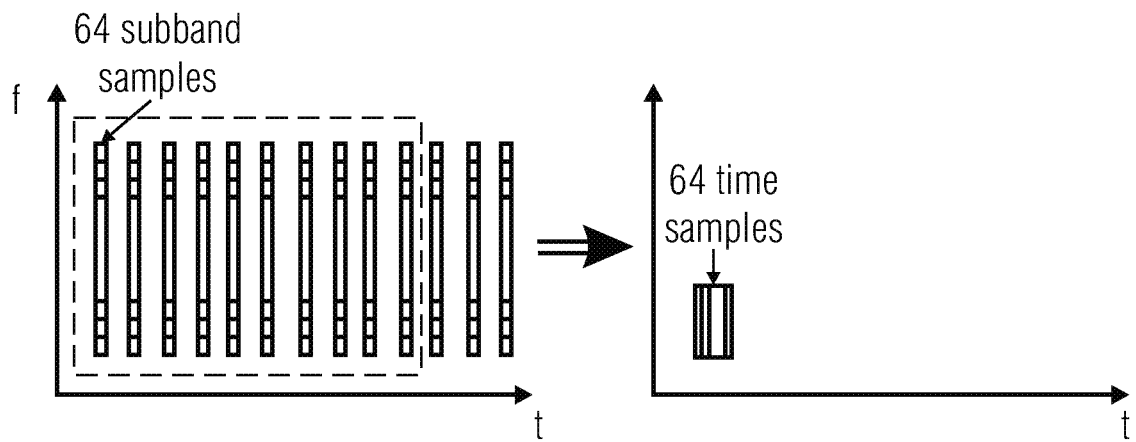
FIG. 3a-3b illustrate the transformation of time-frequency domain samples into time domain samples, FIG. 4 depict in a further illustration the transformation of time-frequency domain samples into time domain samples, FIG. 5 illustrate two diagrams depicting a basic concept of an embodiment.
Figure 3B:
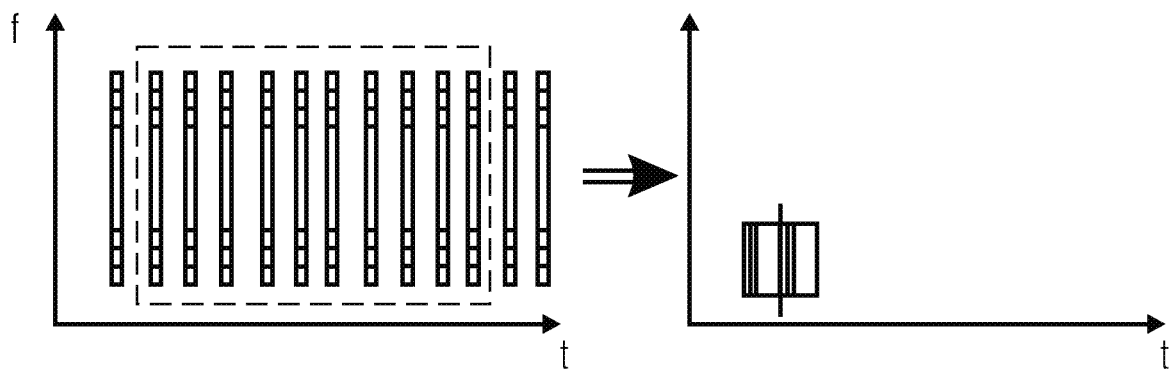

FIG. 3a-3b illustrate the transformation of time-frequency domain samples into time domain samples:

The left side of FIG. 3a illustrates a plurality of sets of subband samples in a time-frequency domain. In more detail, each longitudinal box in FIG. 3a represents a plurality of 64 subband samples in a time-frequency domain. A sliding window in the time-frequency domain covers 10 time indexes each comprising 64 subband samples in the time-frequency domain. By conducting an Inverse Short Time Fourier Transform (ISTFT), 64 time samples are generated from the considered (10 times 64) subband samples, as depicted in FIG. 3a, right side.

In a subsequent processing step illustrated in FIG. 3b, the oldest set of 64 subband values is discarded. Instead, the sliding window now covers a new set of 64 subband values having a different time index in the time-frequency domain. 64 new time samples are generated in the time domain from the considered 640 subband samples (576 old subband samples and 64 new subband samples considered for the first time). FIG. 3b, right side, illustrates the situation in the time domain. FIG. 3b depicts 64 old time samples generated by conducting the ISTFT as illustrated in FIG. 3a are depicted together with the 64 new time samples generated in the processing step of FIG. 3b.

The process illustrated in FIGS. 3a-3b is conducted repeatedly to generate additional time samples from additional subband samples. To explain the concept of the synthesis filter bank 130 in general terms, 64 new subband samples in a time-frequency domain are needed to generate 64 new time samples in a time domain.

It is understood by a person skilled in the art, that the number of time samples which are generated by a synthesis filter bank depends on the number of channels of the synthesis filter bank. For example, the synthesis filter bank might comprise 16, 32, 96 or 128 channels, such that 16, 32, 96, or 128 time samples in a time domain might be generated from e.g. 16, 32, 96 or 128 subband samples in a time-frequency domain, respectively.

FIG. 4 presents another illustration depicting the transformation of time-frequency domain samples into time domain samples. In each processing step, an additional 64 subband samples are considered (i.e. the 64 subband samples of the next time index in a time-frequency domain). Taking the latest 64 subband samples into account, 64 new time samples can be generated. The sampling rate of the signal in the time domain is 64 times the sampling rate of each one of the 64 subband signals.

FIG. 5 illustrates two diagrams depicting a basic concept of an embodiment. The upper part of FIG. 5 depicts a plurality of subband samples of a signal in a time-frequency domain. The abscissa represents time. The ordinate represents frequency. FIG. 5 differs from FIG. 4 in that for each time index, the signal in the time-frequency domain contains three additional subband samples (marked with "x"). I.e. the three additional subbands have been added such that the signal in the time-frequency domain does not only have 64 subband signals, but now does have 67 subband signals. The diagram illustrated at the bottom of FIG. 5 illustrates time samples of the same signal in the time domain after conducting an Inverse Short Time Fourier Transform (ISTFT). As 3 subbands have been added in the time-frequency domain, the 67 additional subband samples of a particular time index in the time-frequency domain can be used to generate 67 new time samples of the audio signal in the time domain. As new 67 time samples have been generated in the time domain using the 67 additional subband samples of a single time index in the time-frequency domain, the sampling rate of the audio signal $s_2$ in the time domain as outputted by the synthesis filter bank 130 is 67 times the sampling rate of each one of the subband signals. As could be seen above, employing 64 channels in the analysis filter bank 120 results in a sampling rate of each subband signal of ¹⁄₆₄ of the sampling rate of the processed audio signal $s_1$ as fed into the analysis filter bank 120. Regarding the analysis filter bank 120 and the synthesis filter bank 130 together, the analysis filter bank 120 having 64 channels and the synthesis filter bank 130 having 67 channels results in a sampling rate of the signal $s_2$ outputted by the synthesis filter bank of 67/64 times the sampling rate of the audio signal $S_1$ being inputted into the analysis filter bank 120.

The following concept can be derived: Consider a (processed) audio signal $s_1$ that is fed into the analysis filter bank 120. Assuming that the filter bank has $c_1$ channels and, assuming further that the sampling rate of the processed audio signal is $sr_1$, then the sampling rate of each subband signal is $sr_1/c_1$. Assuming further that the synthesis filter bank has $c_2$ channels and assuming that the sampling rate of each subband signal is $sr_{subband}$, then the sampling rate of the audio signal $s_2$ being outputted by the synthesis filter bank 130 is $c_2 \cdot sr_{subband}$. That means, the sampling rate of the audio signal being outputted by the synthesis filter bank 130 is $c_2/c_1 \cdot sr_1$. Selecting $c_2$ different from $c_1$ means that the sampling rate of the audio signal $s_2$ being outputted by the synthesis filter bank 130 can be set differently from the sampling rate of the audio signal being inputted into the analysis filter bank 120.

Choosing $c_2$ different from $c_1$ does not only mean that the number of analysis filter bank channels differs from the number of synthesis filter bank channels. Moreover, the number of subband signals being generated by the analysis filter bank 120 by the STFT differs from the number of subband signals that are needed when conducting the ISTFT by the synthesis filter bank 130.

Three different situations can be distinguished:

If $c_1$ is equal to $c_2$, the number of subband signals that are generated by the analysis filter bank 120 is equal to the number of subband signals needed by the synthesis filter bank 130 for the ISTFT. No subband adjustment is needed.

If $c_2$ is smaller than $c_1$, the number of subband signals generated by the analysis filter bank 120 is greater than the number of subband signals needed by the synthesis filter bank 130 for synthesis. According to an embodiment, the highest frequency subband signals might be deleted. For example, if the analysis filter bank 120 generates 64 subband signals and if the synthesis filter bank 130 only needs 61 subband signals, the three subband signals with the highest frequency might be discarded.

If $c_2$ is greater than $c_1$, then the number of subband signals generated by the analysis filter bank 120 is smaller than the number of subband signals needed by the synthesis filter bank 130 for synthesis.

According to an embodiment, additional subband signals might be generated by adding zero signals as additional subband signals. A zero signal is a signal where the amplitude values of each subband sample are equal to zero.

According to another embodiment, additional subband signals might be generated by adding pseudorandom subband signals as additional subband signals. A pseudorandom subband signal is a signal where the values of each subband sample comprise pseudorandom data, wherein the pseudorandom data has to be determined pseudorandomly from an allowed value range. For example, the pseudorandomly chosen amplitude values of a sample have to be smaller than a maximum amplitude value and the phase values of a sample have to be in the range between 0 and $2\pi$ (inclusive).

In another embodiment, additional subband signals might be generated by copying the sample values of the highest subband signal and to use them as sample values of the additional subband signals. In another embodiment, the phase values of the highest subband are copied and used as sample values for an additional subband, while the amplitude values of the highest subband signal are multiplied with a weighting factor, e.g. to decrease their weight and are then used as amplitude values of the subband samples of the additional subband signal. For example, all amplitude values in an additional subband signal might be multiplied with the weighting factor 0.9. If two additional subband signals are needed, the amplitude values of the highest subband signal might be multiplied with a weighting factor 0.9 to generate a first additional subband signal, while all amplitude values might be multiplied with a weighting factor 0.8 to generate a second additional subband signal.

Most highly efficient audio codecs use parametric signal enhancements, which in turn frequently use a QMF (Quadrature Mirror Filter) (i.e. MPEG-4 HE-AAC), where the concepts proposed in the above-described embodiments may also be employed. QMF based codecs use typically a $N_{nominal}=64$ band polyphase filter structure to convert sub bands into a time domain output signal of a nominal sampling frequency $f_{s,nominal}$. By changing the amount of output bands, by adding sub bands containing a zero signal, or removing some of the higher bands (which might be empty anyway), the output sampling $f_s$ rate can be changed in steps of $\Delta f_s$ as shown below.

$$\Delta f_s = \frac{f_{s,nominal}}{N_{nominal}}$$

which results in an overall output sampling frequency $f_s$ of:

$$f_s = \frac{N}{N_{nominal}} f_{s,nominal}$$

Instead of adding an extra sampling rate converter, this functionality can be built into the already existing QMF synthesis filter.

The workload increase is below that of a sampling rate converter with comparable accuracy, but the sampling rate ratio cannot be arbitrary. Essentially it is determined by the ratio of the number of bands used in the QMF analysis and QMF synthesis filter bank. Generally it is advantageous to use a number of output bands that allows a fast computation of the synthesis QMF, e.g. 60, 72, 80, 48, . . . .

The same way as the output sample rate can be changed when employing QMF, the same way can the sample rate of a audio signal codec be adjusted, which uses another kind of filter bank, for example a MDCT (Modified Discrete Cosine Transform).

Figure 6:
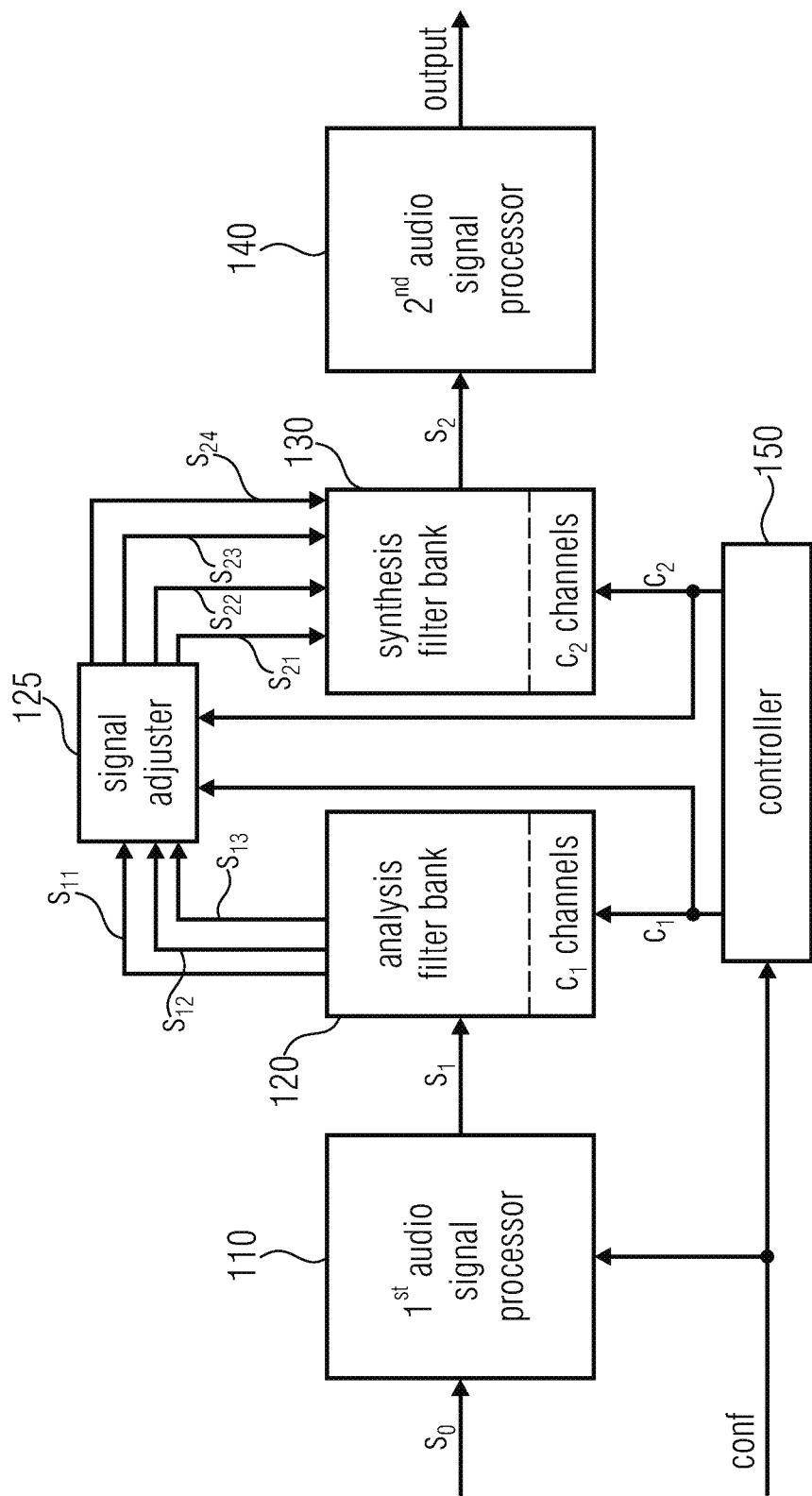
FIG. 6 illustrates an apparatus according to a further embodiment.

FIG. 6 illustrates an apparatus according to an embodiment. The apparatus comprises a signal adjuster 125. An analysis filter bank 120 is adapted to transform the analysis filter bank input signal $s_1$ being represented in a time-domain into a first time-frequency domain audio signal having a plurality of, e.g., 3 first subband signals $s_{11}$, $s_{12}$, $s_{13}$. The number of first subband signals is equal to the first number $c_1$ of analysis filter bank channels, The signal adjuster 125 is adapted to generate a second time-frequency domain audio signal from the first time-frequency domain audio signal based on the configuration setting conf. The second time-frequency domain audio signal has a plurality of, e.g., 4 second subband signals $s_{21}$, $s_{22}$, $s_{23}$, $s_{24}$. The second time-frequency domain audio signal is generated such that the number of second subband signals is equal to the number $c_2$ of synthesis filter bank channels. The number of second subband signals of the second time-frequency domain audio signal may be different from the number of subband signals of the first time-frequency domain audio signal. Therefore, the number of subband signals may have to be adjusted, e.g. according to one of the above-described concepts.

The synthesis filter bank 130 is adapted to transform the second time-frequency domain audio signal into a time-domain audio signal as the audio signal output $s_2$ of the synthesis filter bank 130.

However, in other embodiments, a signal adjuster 125 may not be comprised. If the analysis filter bank 120 provides more channels than needed by the synthesis filter bank 130, the synthesis filter bank may itself discard channels that are not necessary. Furthermore, the synthesis filter bank 130 may be configured to itself use a zero subband signal or a signal comprising pseudorandom data, if the number of subband signals provided by the analysis filter bank 120 is smaller than the number of synthesis filter bank channels.

The apparatus according to the embodiment is particularly suitable for adapting to different situations. For example, the first audio signal processor 110 might need to process the audio signal $s_0$ such that the processed audio signal $s_1$ has a first sampling rate $sr_1$ in one situation and such that the processed audio signal $s_1$ has a second sampling rate $sr_1'$ being different from the first sampling rate in a second situation. For example, the first audio signal processor 110 might employ an ACELP (Algebraic Code Excited Linear Prediction) decoding tool working with a first sampling rate of e.g. 16000 Hz while in a different second situation the first audio signal processor might employ an AAC (Advanced Audio Coding) decoder, e.g. having a sampling rate of e.g. 48000 Hz. Furthermore, the situation might arise that the first audio signal processor employs an AAC decoder which switches between different sampling rates. Or, the first signal processor 110 might be adapted to switch between a first stereo audio signal $s_1$ having a first sampling rate $sr_1$ and a second audio $s_1'$ signal being an MPEG Surround signal having a second sampling rate $sr_1'$.

Moreover, it might be useful to provide an audio signal to the second audio signal processor 140 having a certain predetermined sampling rate $sr_2$. For example, a digital to analogue converter employed might involve a certain sampling rate. In this case, the second signal processor 140 might work with a fixed second sampling rate $sr_2$. However, in other cases, sampling rates of the audio signal $s_2$ at the second audio processor 140 might change at run time. For example, in a first case, the second audio signal processor 140 might switch between a first low audio quality D/A (digital to analogue) converter supporting a relatively low sampling rate of e.g. 24000 Hz, while in other situations the second audio signal processor 140 might employ a second D/A converter having a sampling rate of e.g. 96000 Hz. For example, in situations where the original sampling rate of the processed audio signal $sr_2$ having been processed by the first audio signal processor 110 has a relatively low sampling rate of e.g. 4000 Hz it might not be necessary to employ the high-quality second D/A converter having a sampling rate of 96000 Hz, but instead, it is sufficient to employ the first D/A converter which may use fewer computational resources. It is therefore appreciated to provide an apparatus with adjustable sampling rates.

According to an embodiment, an apparatus is provided which comprises a controller 150 which controls the first number of analysis filter bank channels $c_1$ and/or the second number of synthesis filter bank channels $c_2$ in accordance with a configuration setting conf provided to the configurable first audio signal processor 110, so that an audio signal output by the synthesis filter bank 130 has the predetermined sampling rate $sr_2$ or a sampling rate $sr_2$ being different from the predetermined sampling rate $sr_2$, but being closer to the predetermined sampling rate $sr_2$ than the sampling rate $sr_1$ of a processed input signal $s_1$ into the analysis filter bank 120.

In an embodiment, the configuration setting might contain an explicit information about the first sampling rate $sr_1$ and/or the second sampling rate $sr_2$. For example, the configuration setting might explicitly define that a first sampling rate $sr_1$ is set to 9000 Hz and that a second sampling rate $sr_2$ is set to 24000 Hz.

However, in another embodiment, the configuration setting conf may not explicitly specify a sampling rate. Instead, an index number might be specified which the controller might use to determine the first $sr_1$ and/or the second sampling rate $sr_2$.

In an embodiment, the configuration setting conf may be provided by an additional unit (not shown) to the controller at run time. For example, the additional unit might specify in the configuration setting conf, whether an ACELP decoder or an AAC decoder is employed.

In an alternative embodiment, the configuration setting conf is not provided at run-time by an additional unit, but the configuration setting conf is stored once such that it is permanently available for a controller 150. The configuration setting conf then remains unaltered for a longer time period.

Depending on this determination, the additional unit may send the explicit sampling rates to the controller being comprised in the configuration setting conf.

In an alternative embodiment, the additional unit sends a configuration setting conf which indicates whether a first situation exists (by transmitting an index value "0": indicating "ACELP decoder used", or by transmitting an index value "1": indicating "AAC decoder used"). This is explained with reference to FIGS. 7a and 7b:

FIGS. 7a and 7b illustrate lookup tables according to an embodiment being available to a controller. For example, the lookup table may be predefined lookup table being stored as a fixed table in the controller. In another embodiment, the lookup table may be provided as meta information from an additional unit. While, for example, the lookup table information is only sent once for a long period of time, an index value specifying the current sampling rate configuration is more frequently updated.

FIG. 7a depicts a simple lookup table allowing the resolution of a single sampling rate, in the embodiment of FIG. 7a a sampling rate of the first audio signal processor 110 is specified. By receiving an index value being comprised in the first configuration setting conf, the controller 150 is able to determine the sampling rate of the processed audio signal $s_1$ being processed by the first audio signal processor 110. In the lookup table of FIG. 7a, no information about the second sampling rate $sr_2$ is available. In an embodiment, the second sampling rate is a fixed sampling rate and is known by the controller 150. In another embodiment, the second sampling rate is determined by employing another lookup table being similar as the lookup table illustrated in FIG. 7a.

FIG. 7b illustrates another lookup table which comprises information about the first sampling rate $sr_1$ of the processed audio signal $s_1$ as well as the second sampling rate $sr_2$ of the audio signal $s_2$ being outputted by the synthesis filter bank. An additional unit transmits a configuration setting conf comprising an index value to the controller 150. The controller 150 looks up the index value in the lookup table of FIG. 7b and thus determines the first desired sampling rate of the processed audio signal $s_1$ and the second desired sampling rate $sr_2$ of the audio signal $s_2$ being generated by the synthesis filter bank 140.

Figure 8:
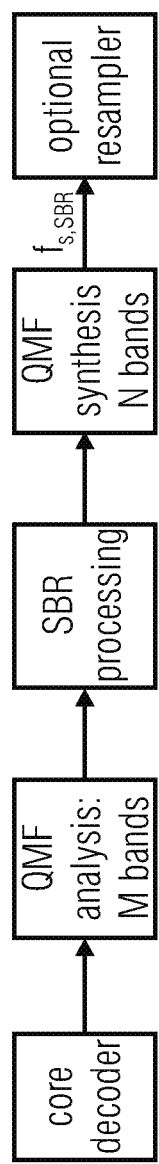
FIG. 8 illustrates an apparatus according to an embodiment employing SBR processing.

FIG. 8 illustrates a combination of the above-described concepts with SBR processing. If the QMF synthesis band is part of an SBR module, the resampling functionality can be integrated into the system. In particular, it is then possible to transmit SBR parameters to extend the active SBR range beyond the usual 2:1 or 4:1 resampling ratio with the additional merit that it is possible to realize almost arbitrary resampling ratios by adequately choosing the appropriate M and N of the QMF filter banks, thus increasing the degrees of freedom for overall resampling characteristic (see FIG. 8).

For example, if the number of synthesis bands is higher than 64, they do not necessarily have to be filled with zeros. Instead, the range for the SBR patching could also be extended in order to make use of this higher frequency range.

In FIG. 8, the resulting QMF output sampling frequency is:

$$f_{s,SBR} = \frac{N}{M} f_{s,Core}$$

E.g. in case of the USAC 8 kbps operation test point, the internal sampling frequency $f_{s,Core}$ is typically chosen to be 9.6 kHz. While sticking to the M=32 band QMF analysis filter bank, the synthesis could be replaced by an N=80 band QMF bank. This would result in an output sampling frequency of $$f_{s,SBR} = \frac{N}{M} f_{s,Core} = \frac{80}{32} 9600 \text{ Hz} = 24000 \text{ Hz}.$$

By doing so, the potential audio bandwidth which can be covered by SBR can be increased to 12 kHz. At the same time a potential post-resampling step to a convenient 48 kHz can be implemented rather cheaply because the remaining resampling ratio is a simple 1:2 relation.

Many more combinations are conceivable which could allow a wide(r) SBR range while maintaining the possibility to allow the core coder to run on somewhat unusual or uncommon sampling frequencies.

Figure 9:
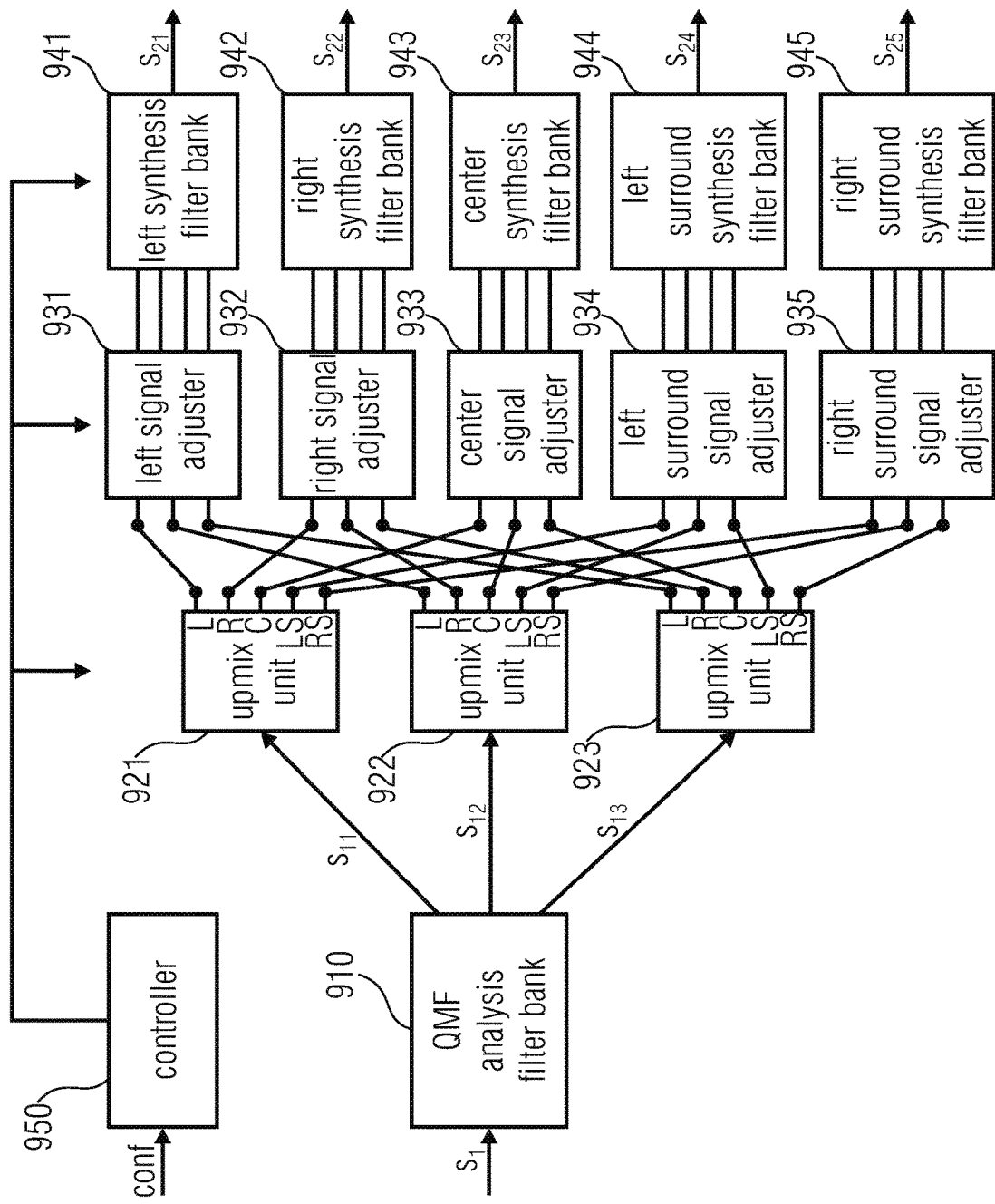
FIG. 9 depicts an apparatus according to another embodiment employing QMF analysis and synthesis filter banks for upmixing an MPEG Surround signal with a resampled sampling rate according to an embodiment

FIG. 9 illustrates an apparatus according to another embodiment employing QMF analysis and synthesis filter banks for upmixing an MPEG Surround signal with a resampled sampling rate according to an embodiment. For illustrative purposes, the analysis filter bank is depicted to generate only 3 subband signals from the inputted signal and each one of the QMF synthesis filter banks is depicted to transform a time-frequency domain signal comprising only four subband signals back to the time domain. However, it is understood that in other embodiments, the analysis filterbank might, for example, comprise 45 channels and the synthesis filterbank might, for example, comprise 60 channels, respectively.

In FIG. 9, a downmixed audio signal $s_1$ is fed into a QMF analysis filter bank 910. The QMF analysis filter bank 910 transforms the downmixed time domain audio signal into a time-frequency domain to obtain three (downmixed) subband signals $s_{11}$, $s_{12}$, $s_{13}$. The three downmixed subband signals $s_{11}$, $s_{12}$, $s_{13}$ are then fed into three upmix units 921, 922, 923, respectively. Each one of the upmix units 921, 922, 923 generates five surround subband signals as a left, right, center, left surround and right surround subband signal, respectively. The three generated left subband signals are then fed into a left signal adjuster 931 for the left subband signals. The left signal adjuster 931 generates four left subband signals from the three left surround subband signals and feeds them into a left synthesis filter bank 941 which transforms the subband signals from the time-frequency domain to the time domain to generate a left channel $s_{21}$ of the surround signal in a time domain. In the same way, a right signal adjuster 932 and a right synthesis filter bank 942 is employed to generate a right channel $s_{22}$, a center signal adjuster 933 and a center synthesis filter bank 943 is employed to generate a center channel $s_{23}$, a left surround signal adjuster 934 and a left surround synthesis filter bank 944 is employed to generate a left surround channel $s_{24}$, and a right surround signal adjuster 935 and a right surround synthesis filter bank 945 is employed to generate a right surround channel $s_{25}$ of the surround signal in the time domain.

A controller (950) receives a configuration setting conf and is adapted to control the number of channels of the analysis filter bank 910 based on the received configuration setting conf. The controller is further adapted to control the number of channels of the synthesis filter bank units 941, 942, 943, 944, 945, the number of the first plurality of input surround subband signals of the signal adjuster units 931, 932, 933, 934, 935 and the number of the second plurality of output surround subband signals of the signal adjuster units 931, 932, 933, 934, 935 based on the received configuration setting conf.

Figure 10:
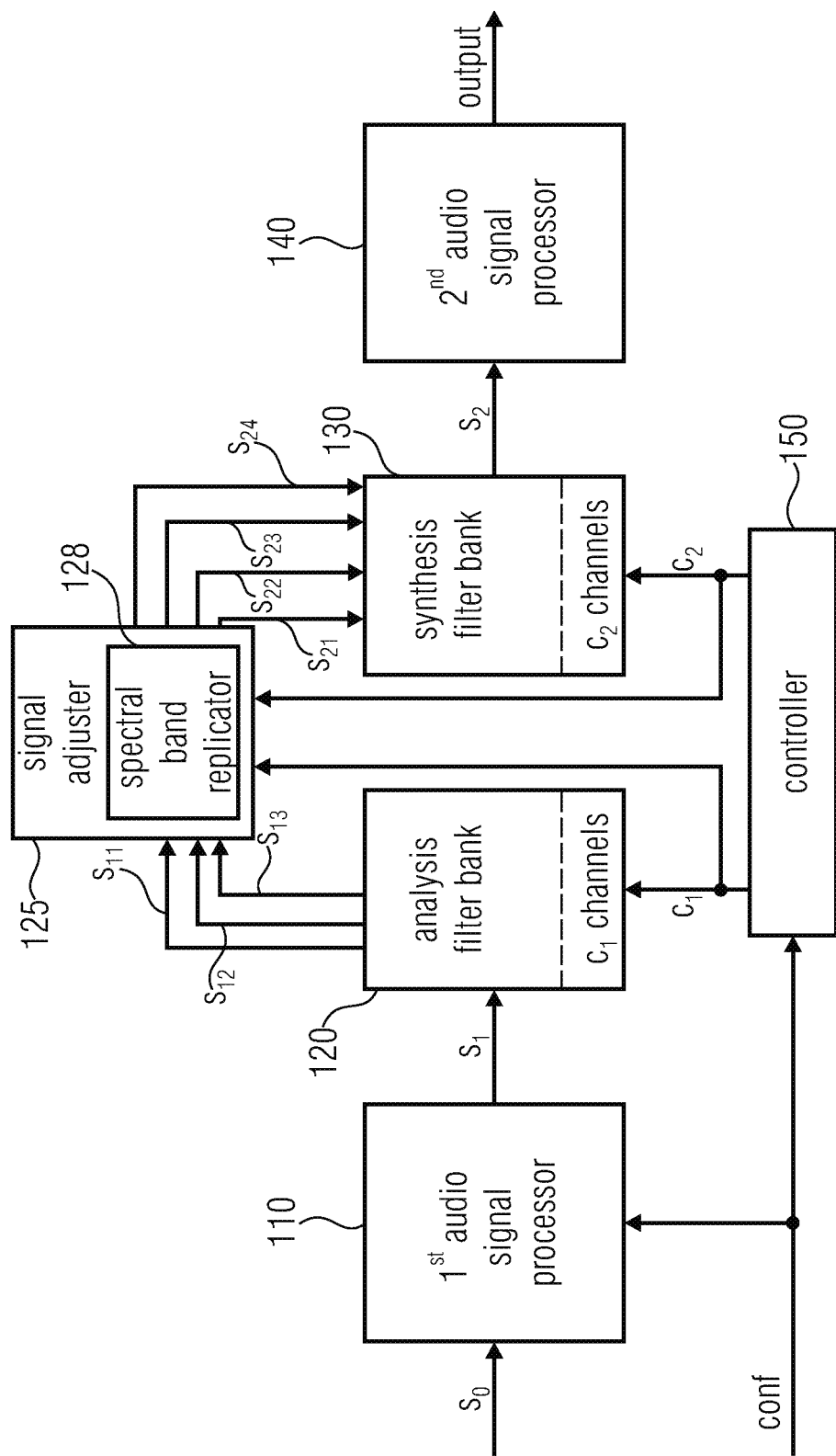
FIG. 10 illustrates an apparatus according to another embodiment employing SBR processing.

FIG. 10 illustrates an apparatus according to another embodiment. The embodiment of FIG. 10 differs from the embodiment of FIG. 8 in that the signal adjuster 125 further comprises a spectral band replicator 128 for conducting a spectral band replication (SBR) of the subband signals derived from the analysis filter bank 120 to obtain additional subband signals.

Conventionally, by conducting spectral band replication a plurality of subband signals is "replicated" such that the number of subband signals derived from the spectral band replication is twice or four times the number of the subband signals available for being spectrally replicated. In a conventional spectral band replication (SBR), the number of available subband signals is replicated so that e.g. 32 subband signals (resulting from an analysis filter bank transformation) are replicated and such that 64 subband signals are available for the synthesis step. The subband signals are replicated such that the available subband signals form the lower subband signals, while the spectrally replicated subband signals from the higher subband signals being located in frequency ranges higher than the already available subband signals.

According to the embodiment depicted in FIG. 10, the available subband signals are replicated such that the number of subband signals resulting from SBR does not have to be an integer multiple of (or the same number as) the replicated subband signals. For example, 32 subband signals might be replicated such that not 32 additional subband signals are derived, but, for example, 36 additional subband signals are derived and that in total, for example, 68 instead of 64 subband signals are available from synthesis. The synthesis filter bank 130 of the embodiment of FIG. 10 is adjusted to process 68 channels instead of 64.

According to the embodiment illustrated in FIG. 10, the number of channels that are replicated by the spectral band replication and the number of channels that can be replicated is adjustable such that the number of replicated channels does not have to be an integer multiple of (or the same number as) the channels used in the spectral band replications. In the embodiment of FIG. 10, the controller not only controls the number of channels of the synthesis filter bank 140, but does also control the number of channels to be replicated by the spectral band replication. For example, if the controller has determined that the analysis filter bank 120 has $c_1$ channels and the synthesis filter bank has $c_2$ channels ($c_2 > c_1$), then the number of additional channels that have to be derived by the spectral band replication is $c_2 - c_1$.

If $c_2 > 2 \cdot c_1$, the question arises how to generate additional subband signals in the context of a spectral band replication. According to an embodiment, a zero subband signal (the amplitude values of all subband samples are zero) may be added for each subband signal that may be additionally used. In another embodiment, pseudorandom data is used as sample values of the additional subband signals to be generated. In a further embodiment, the highest subband signal resulting from the spectral band replication is itself replicated: For example, the amplitude values of the highest subband signals are duplicated to form the amplitude values of the additional one or more subband signal. The amplitude values might be multiplied by a weighting factor. For example, each one of the amplitude values of the first additional subband signal might be multiplied by 0.95. Each one of the amplitude values of the second additional subband signal might be multiplied by 0.90, etc.

In a still further embodiment, the spectral band replication is extended to generate additional subband signals. Spectral envelope information might be used to generate additional subband signals from the available lower subband signals. The spectral envelope information might be used to derive weighting factors used to be multiplied by the amplitude values of the lower subband signals considered in the spectral band replication to generate additional subband signal.

Figure 11:
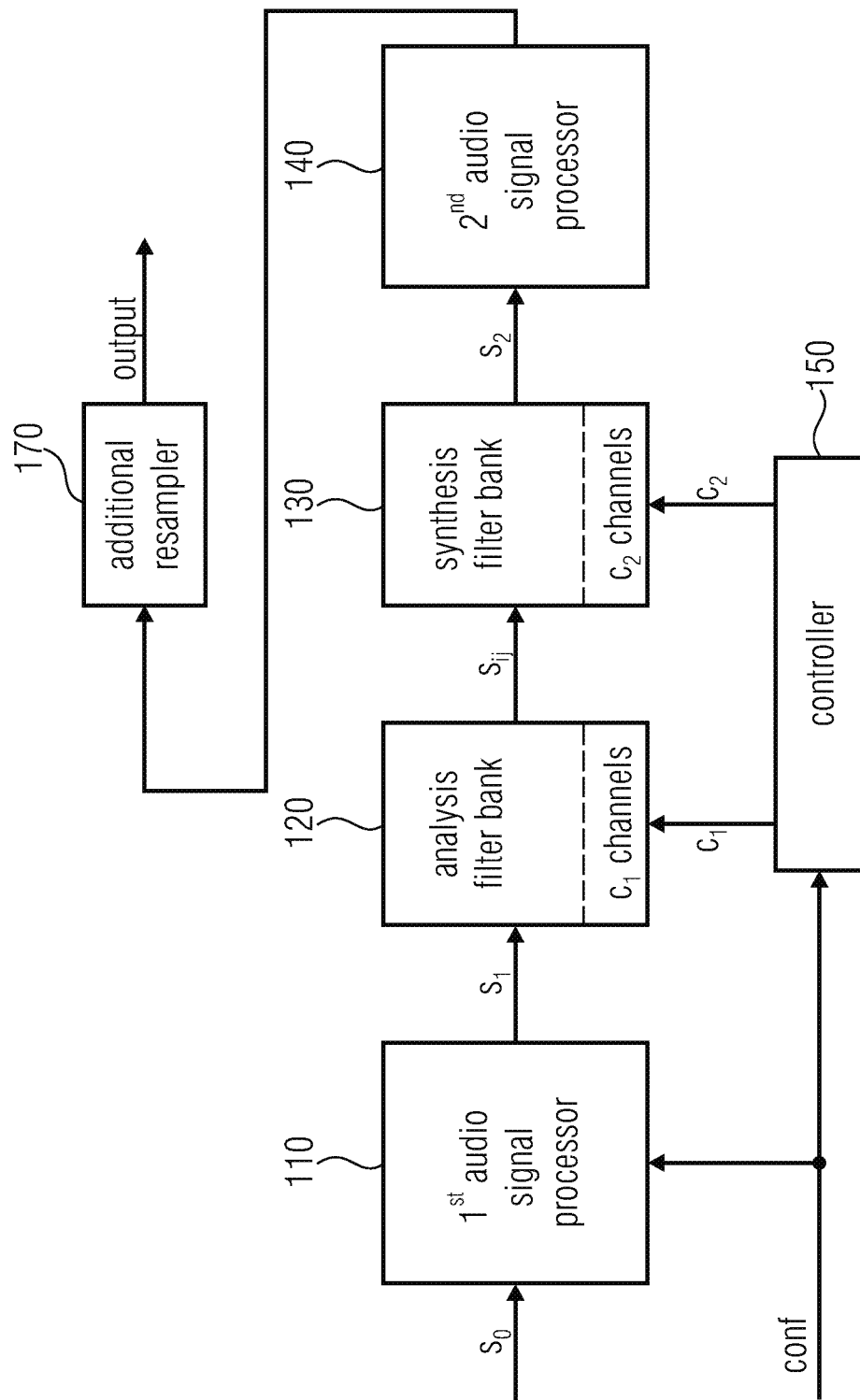
FIG. 11 depicts an apparatus according to another embodiment comprising an additional resampler.

FIG. 11 illustrates an apparatus according to another embodiment. The apparatus differs from the apparatus illustrated in FIG. 1 in that the apparatus of FIG. 11 further comprises an additional resampler 170. The additional resampler 170 is used to conduct an additional resampling step. The resampler may be a conventional resampler or may alternatively be an apparatus for processing an audio signal which conducts resampling according to the invention. If, for example an apparatus according to the invention is used as additional resampler, the first apparatus according to the invention resamples an audio signal having a first sampling rate $sr_1$ to a sampling rate $sr_2 = c_2/c_1 \cdot sr_1$. Then, the additional resampler resamples the audio signal from a sampling rate $sr_2$ to a sampling rate $sr_2' = c_4/c_3 \cdot sr_2 = c_4/c_3 \cdot c_2/c_1 \cdot sr_1$. By employing two resamplers, it is avoided that a resampler according to one of the above-described embodiments has to have $c_1 \cdot c_3$ analysis channels and $c_4 \cdot c_2$ synthesis channels. For example, if a resampling factor of 998000/996003 is desired (the resampling factor is the ratio of the sampling rate of the audio signal after synthesis to the sampling rate of the audio signal before analysis), then, an apparatus comprising two resamplers avoids that 996003 analysis filter bank channels and 998000 synthesis filter bank channels are needed. Instead, a first resampling may be conducted by an analysis filter bank having 999 fiter bank channels and a synthesis filter bank having 1000 channels and a second resampling may be conducted by an analysis filter bank having 997 channels and a synthesis filter bank having 998 channels.

In the embodiment, the controller 150 may be adapted to steer how to split the resampling factor into suitable analysis and synthesis filter bank channel values.

Figure 12:
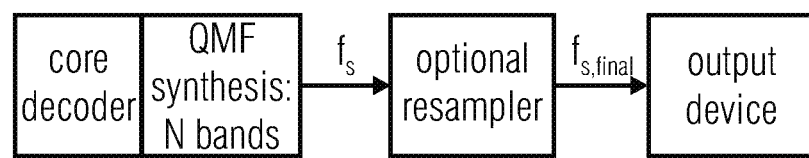
FIG. 12 illustrates an apparatus employing QMF as resampler according to an embodiment.

FIG. 12 illustrates QMF as resampler according to an embodiment. An example of a QMF synthesis stage with attached post-resampler to adjust the QMF output sampling rate is depicted.

If the output sampling rate after QMF synthesis does not comply to a "standard" sampling rate, a combination of QMF based resampling and an additional resampler can still be used in order to achieve better operating conditions for a resampler in case this is useful (e.g. benign small integer resampling ratio (or interpolate between near sampling rates, for example employing a Lagrange interpolator).

Figure 13:
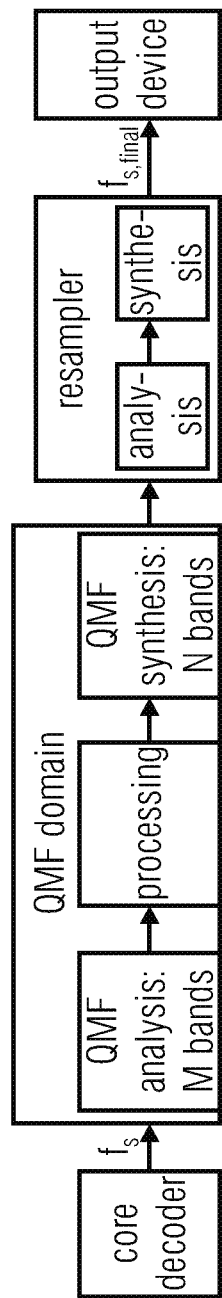
FIG. 13 shows an apparatus employing an additional resampler according to an embodiment.
Figure 14:
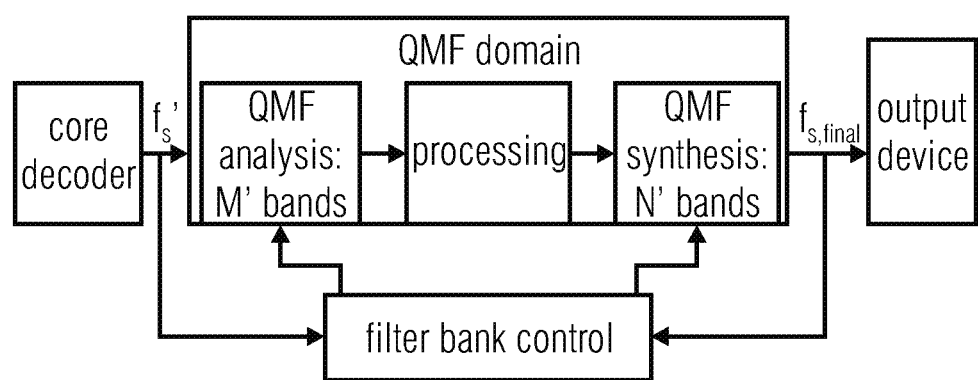
FIG. 14 illustrates an apparatus employing QMF as resampler according to another embodiment.

In FIG. 13, a resampler is depicted comprising an analysis unit and a synthesis unit. But since such building blocks are already present in most current audio codecs, these already existing building blocks can be slightly changed, by means of a controlling entity, in order to accomplish the resampling task, without requiring additional analysis/synthesis stages appended to the decoder system. This approach is shown in FIG. 14. In some systems it might be possible to slightly change $f_s$ in order to achieve more convenient operating points and overcome implementation constraints in regard to the overall decimation and upsampling factors.

The "Filter bank control" block shown in FIG. 13 will manipulate the factors M and N of the decoder in order to obtain the desired output sampling frequency $f_{s,final}$. It takes as inputs the desired output sampling frequency $f_{s,final}$, the core decoder output sampling frequency and other knowledge about the decoder. The sampling frequency $f_{s,final}$ may be desired to be constant, and to match the output device hardware, while from the codec perspective it might be desirable to change because of coding efficiency aspects. By merging the resampler into the decoder both requirements, a fixed output sampling rate at the output and best operating sampling rate of the audio codec can be met with almost no additional complexity and no signal degradation because of additional resampler processing.

The QMF prototype for the different lengths can be created from the one for the 64 band QMF by interpolation.

The complexity of a filter bank is directly related to its length. If a filter bank time domain signal synthesis transform is modified for downsampling by reducing the transform length, its complexity will decrease. If it is used for upsampling by enlarging its transform length its complexity will increase, but still far below the complexity that may be involved in the use of an additional resampler with equivalent signal distortion characteristics.

Figure 15:
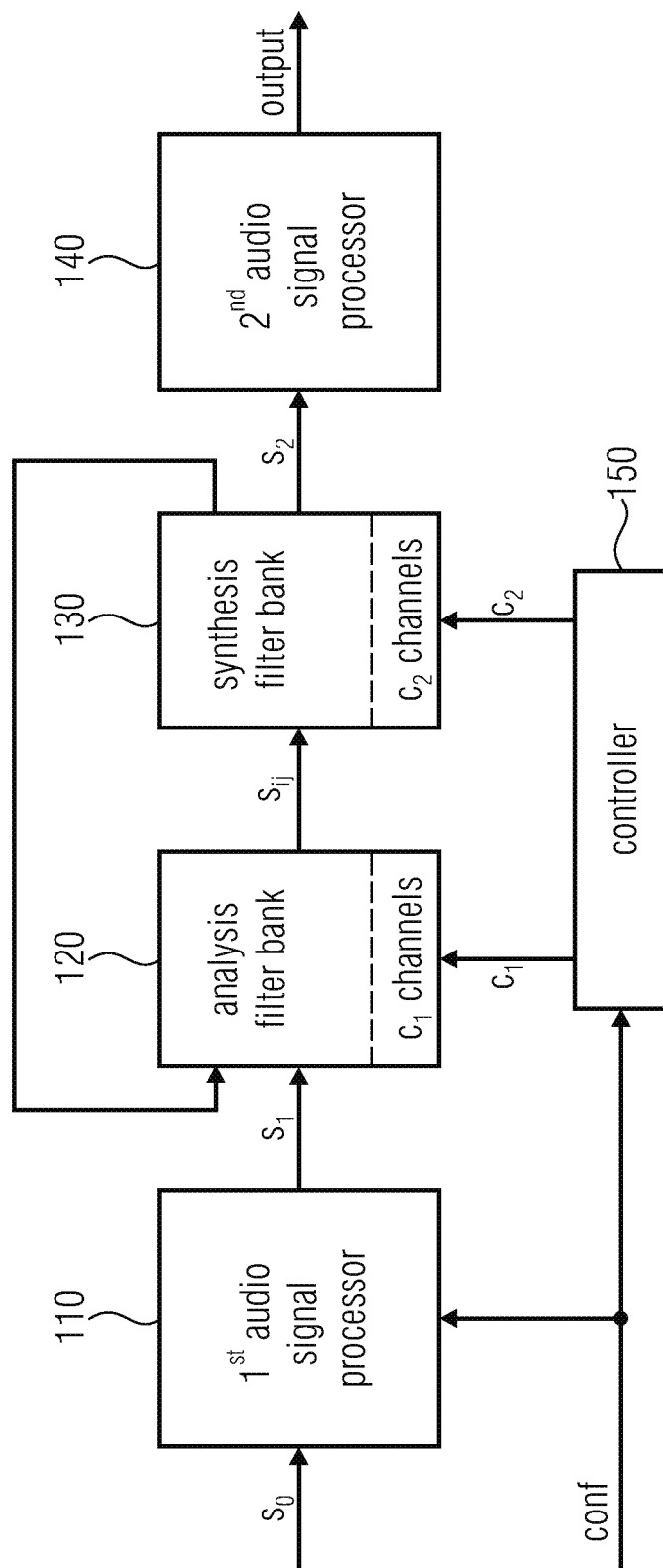
FIG. 15 depicts an apparatus according to a further embodiment wherein the apparatus is adapted to feed the synthesis filter bank output into the analysis filter bank to conduct another transformation cycle.

FIG. 15 illustrates an apparatus according to a further embodiment wherein the apparatus is adapted to feed a synthesis filter bank output into an analysis filter bank to conduct another transformation cycle. As in the embodiment of FIG. 1, a processed audio signal $s_1$ is fed into an analysis filter bank 120 where the audio signal is transferred from a time-domain into a time-frequency domain. The synthesis filter bank then transforms the time-frequency domain signal back to the time domain, wherein the number of synthesis filter bank channels $c_2$ is different from the number of analysis filter bank channels $c_1$ to generate an output signal $s_2$ with a different sampling rate than the inputted signal. Contrary to the embodiment of FIG. 1, however, the output signal may not be fed into the second audio signal processor 140, but instead, may be fed again into an analysis filter bank to conduct an additional resampling of the audio signal by an analysis filter bank and a synthesis filter bank. Different analysis filter banks and synthesis filter banks (e.g. analysis filter bank instances and synthesis filter bank instances) may be employed in subsequent analysis/synthesis steps. The controller 150 may control the number of analysis and synthesis filter bank channels $c_1$, $c_2$, such that the numbers are different in the second analysis/synthesis step than in the first analysis/synthesis step. By this the total resampling ratio may be any be arbitrarily chosen such that it results to $(c_2 \cdot c_4 \cdot c_6 \cdot c_8 \cdot \ldots)/(c_1 \cdot c_3 \cdot c_5 \cdot c_7 \cdot \ldots)$, wherein $c_1, c_2, c_3, \ldots$ are integer values.

Resampling an audio signal having a first sampling rate $sr_1$ such that it has a second sampling rate $sr_2$ after resampling might not be easy to realize. For example, in case that a sampling frequency of 22050 Hz shall be resampled to a sampling frequency of 23983 Hz, it would be computationally expensive to realize an analysis filter bank having 22050 channels and a synthesis filter bank having 23983 channels. However, although it might be desirable to exactly realize the output sampling frequency of 23983 Hz the user (or another application) might tolerate an error as long as the error is within acceptable bounds.

Figure 16:
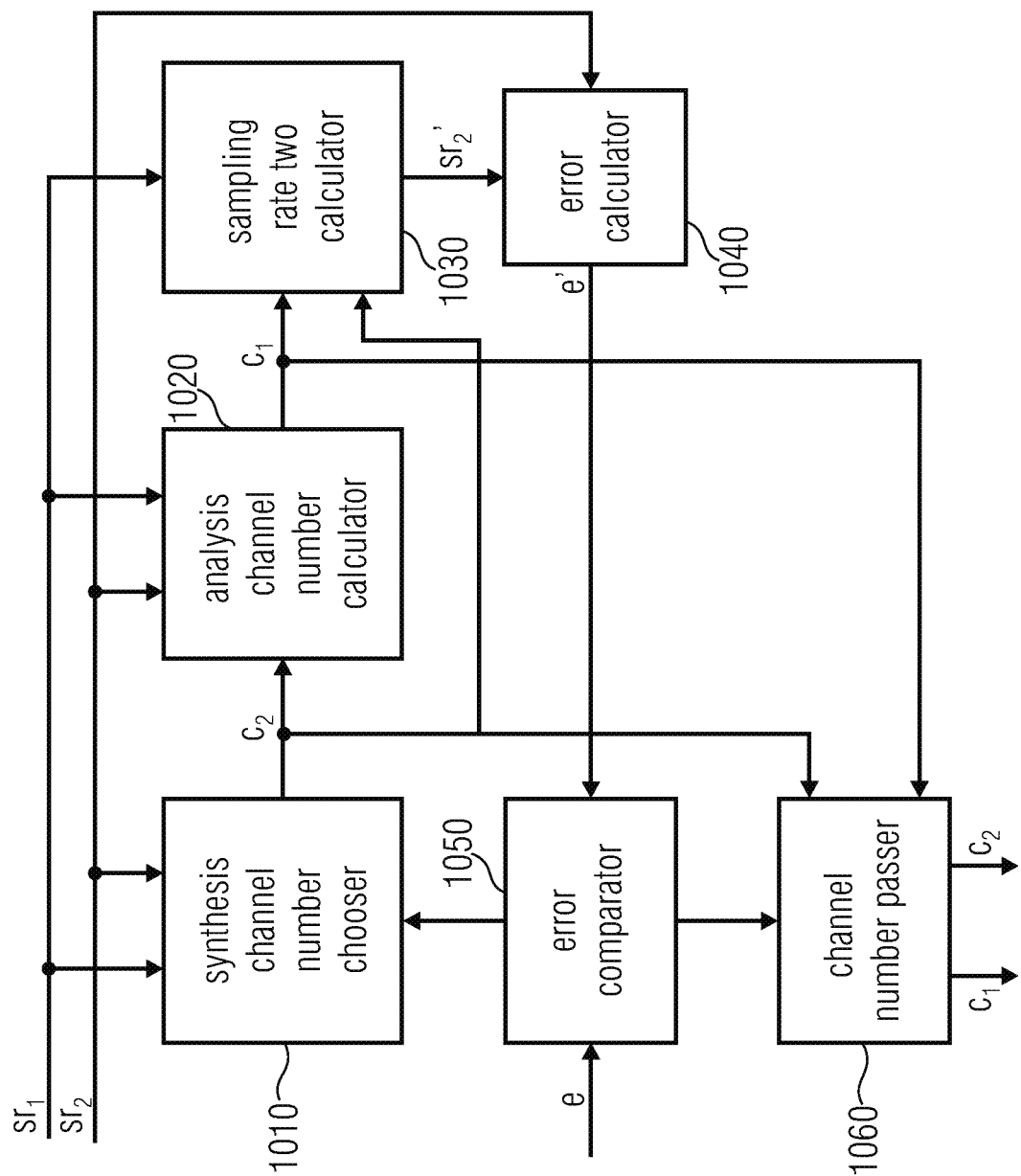
FIG. 16 illustrates a controller according to another embodiment comprising an error comparator.

FIG. 16 illustrates a controller according to another embodiment. A first sampling rate $sr_1$ and a second desired sampling rate $sr_2$ are fed into the controller. The first sampling rate specifies the sampling rate of a (processed) audio signal $s_1$ that is fed into an analysis filter bank. The second desired sampling rate $sr_2$ specifies a desired sampling rate that the audio signal $s_2$ shall exhibit when being outputted from a synthesis filter bank. Furthermore, a tolerable error e is also fed into the controller. The tolerable error e specifies to what degree an actual sampling rate $sr_2'$ of a signal outputted from the synthesis filter bank might deviate from the desired sampling rate $sr_2$.

The first sampling rate $sr_1$ and the second desired sampling rate $sr_2$ are fed into a synthesis channel number chooser 1010. The synthesis channel number chooser 1010 chooses a suitable number of channels $c_2$ of the synthesis filter bank. Some numbers of synthesis filter bank channels $c_2$ might be particularly suitable to allow fast computation, of the signal transformation from a time-frequency domain to a time domain, e.g. 60, 72, 80 or 48 channels. The synthesis channel number chooser 1010 might choose the synthesis channel number $c_2$ depending on the first and second sampling rate $sr_1$, $sr_2$. For example, if the resampling ratio is an integer number, for example 3 (resulting e.g. from sampling rates $sr_1$=16000 Hz and $sr_2$=48000 Hz), it might be sufficient that the synthesis channel number is a small number, e.g. 30. In other situations it might be more useful to choose a bigger synthesis channel number, for example, if the sampling rates are high and if the sampling rate ratio is not an integer number (e.g., if $sr_1$=22050 Hz and $sr_2$ is 24000 Hz): In such a case, the synthesis channel number might, for example, be selected as $c_2$=2000).

In alternative embodiments, only the first $sr_1$ or the second $sr_2$ sampling rate is fed into the synthesis channel number chooser 1010. In still further embodiments, neither the first $sr_1$ nor the second $sr_2$ sampling rate is fed into the synthesis channel number chooser 1010, and the synthesis channel number chooser 1010 then chooses a synthesis channel number $c_2$ independent of the sampling rates $sr_1$, $sr_2$.

The synthesis channel number chooser 1010 feeds the chosen synthesis channel number $c_2$ into an analysis channel number calculator 1020. Furthermore, the first and second sampling rate $sr_1$ and $sr_2$ are also fed into the analysis channel number calculator 1020. The analysis channel number calculator calculates the number of analysis filter bank channels $c_1$ depending on the first and second sampling rate $sr_1$ and $sr_2$ and the synthesis channel number $c_2$ according to the formula:

$$c_1 = c_2 \cdot sr_1 / sr_2.$$

Often, the situation may arise that the calculated number $c_1$ is not an integer number, but a value being different from an integer number. However, the number of analysis filter bank channels (as well as the number of synthesis filter bank channels) has to be an integer. For example, if a first sampling rate $sr_1$ is $sr_1$=22050 Hz, the second desired sampling rate $sr_2$ is $sr_2$=24000 Hz and the number of synthesis filter bank channels $c_2$ has been chosen such that $c_2$=2000, then the calculated number of analysis channels $c_1$ is $c_1 = c_2 \cdot sr_1 / sr_2 = 2000 \cdot 22050/24000 = 1837.5$ analysis channels. Therefore, a decision has to be taken, whether the analysis filter bank should comprise 1837 or 1838 channels.

Different rounding strategies may be applied:

According to one embodiment, a first rounding strategy is applied, according to which the next lower integer value is chosen as analysis channel number, if the calculated value is not an integer. E.g. a calculated value of 1837.4 or 1837.6 would be rounded to 1837.

According to another embodiment, a second rounding strategy is applied, according to which the next higher integer value is chosen as analysis channel number, if the calculated value is not an integer. E.g. a calculated value of 1837.4 or 1837.6 would be rounded to 1838.

According to a still further embodiment, arithmetic rounding is applied. E.g. a calculated value of 1837.5 would be rounded to 1838 and a calculated value of 1837.4 would be rounded to 1837.

However, as it is not possible in the "1837.5" example to apply the exact value of the calculation as the number of analysis filter bank channels, not the desired second sampling rate $sr_2$, but a deviating actual second sampling rate $sr_2'$ will be obtained.

The controller of the embodiment of FIG. 16 comprises a sampling rate two calculator 1030, which calculates the actual second sampling rate $sr_2'$ based the first sampling rate $sr_1$, the chosen number of synthesis filter bank channels $c_2$ and the calculated number of analysis filter bank channels $c_1$ according to the formula:

$$sr_2' = c_2 / c_1 \cdot sr_1.$$

E.g. in the above described example, assuming that the first sampling rate $sr_1$ is $sr_1$=22050 Hz, that the number of synthesis filter bank channels is $c_2$=2000 and selecting the number of analysis filter bank channels $c_1$ to be 1838 this results in an actual second sampling rate of:

$sr_2' = c_2/c_1 \cdot sr_1 = 2000/1838 \cdot 22050$ Hz=23993.47 Hz instead of the desired 24000 Hz.

Applying an analysis filter bank having 1837 channels would result in an actual second sampling rate of:

$sr_2' = c_2/c_1 \cdot sr_1 = 2000/1837 \cdot 22050$ Hz=24006.53 Hz instead of the desired 24000 Hz.

The actual second sampling rate $sr_2'$ of the audio signal being outputted from the synthesis filter bank and the desired sampling rate $sr_2$ are the fed into an error calculator 1040. The error calculator calculates an actual error e' representing the difference between the desired sampling rate $sr_2$ and the actual sampling rate $sr_2'$ according to the selected analysis and synthesis filter bank channel setting.

In an embodiment, the actual error e' might be an absolute value of the difference between the desired sampling rate $sr_2$ and the actual sampling rate according to the formula:

$$e' = |sr_2 - sr_2'|.$$

In another embodiment, the actual error e' might be a relative value, e.g. calculated according to the formula:

$$e' = (sr_2 - sr_2')/sr_2|.$$

The error calculator then passes the actual error e' to an error comparator 1050. The error comparator then compares the actual error e' with the tolerable error e. If the actual error e' is within the bounds defined by the tolerable error, for example, if $|e'| \leq |e|$, then the error comparator 1050 instructs a channel number passer 1060 to pass the actual calculated number of analysis filter bank channels to the analysis filter bank and the determined number of the synthesis filter bank channels to the synthesis filter bank, respectively.

However, if the actual error e' is within the bounds defined by the tolerable error, for example, if $|e'| > |e|$, then the error comparator 1060 starts the determination process from the beginning and instructs the synthesis channel number chooser 1010 to choose a different synthesis channel number as number of synthesis filter bank channels.

Different embodiments may realize different strategies to choose a new synthesis channel number. For example, in an embodiment, a synthesis channel number may be chosen randomly. In another embodiment, a higher channel number is chosen, e.g. a channel number being twice the size of the synthesis channel number that was chosen by the synthesis channel number chooser 1010, before. E.g. $sr_2' := 2 \cdot sr_2$. For example, in the above-mentioned example, the channel number $sr_2 = 2000$ is replaced by $sr_2' := 2 \cdot sr_2 = 2 \cdot 2000 = 4000$.

The process continues until a synthesis channel number with an acceptable actual error e' has been found.

Figure 17:
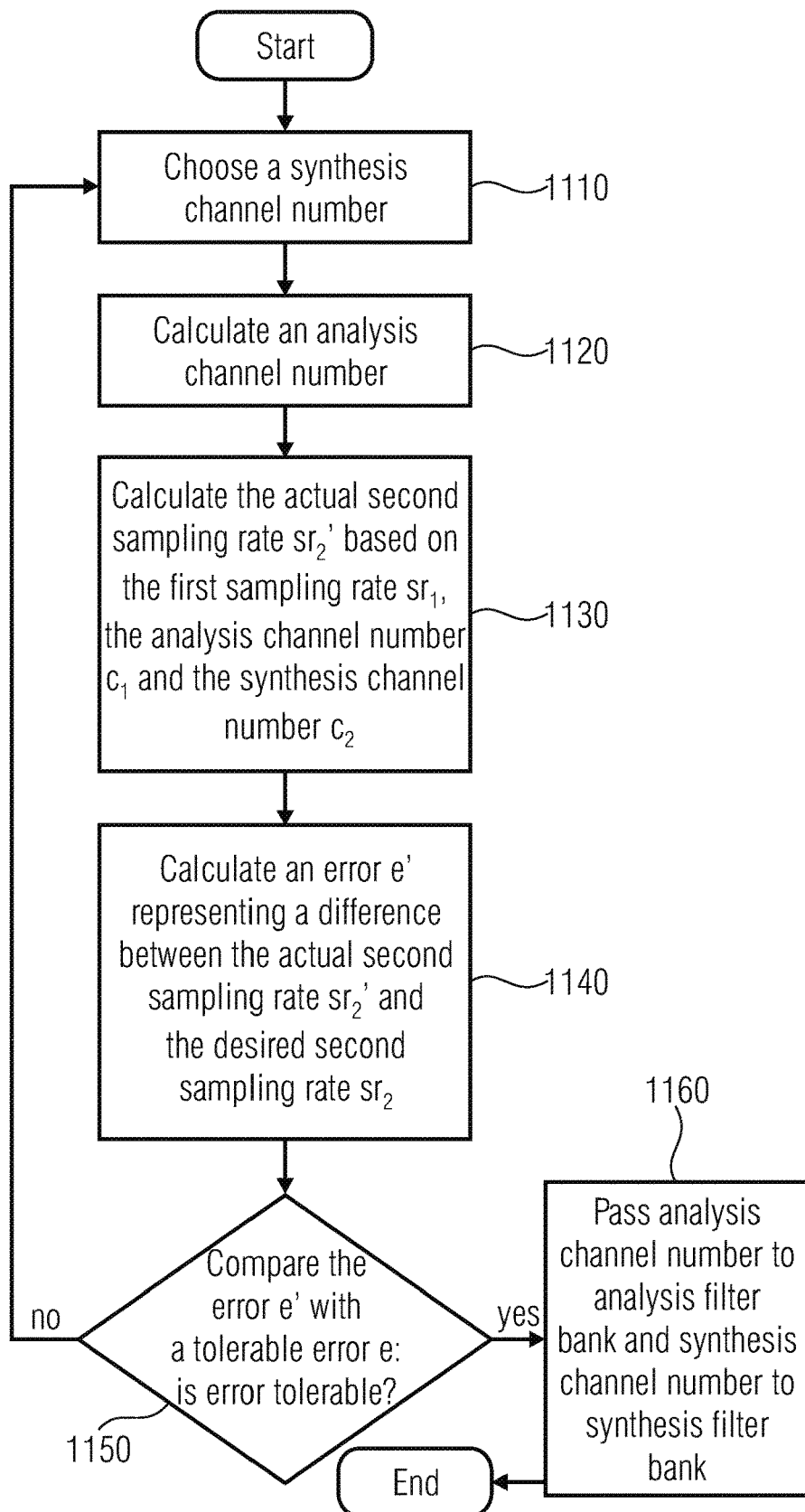
FIG. 17 shows a flow chart depicting a method for determining the number of analysis and synthesis filter bank channels, respectively.

FIG. 17 illustrates a flow chart depicting a corresponding method. In step 1110, a synthesis channel number $c_2$ is chosen. In step 1120, the analysis channel number $c_1$ is calculated based on the chosen synthesis channel number $c_2$, the first sampling rate $sr_1$ and the desired sampling rate $sr_2$. If need be, rounding is performed to determine the analysis channel number $c_1$. In step 1130, the actual second sampling rate is calculated based on the first sampling rate $sr_1$, the chosen number of synthesis filter bank channels $c_2$ and the calculated number of analysis filter bank channels $c_1$. Furthermore, in step 1140, an actual error e' representing a difference between the actual second sampling rate $sr_2'$ and the desired second sampling rate $sr_2$ is calculated. In step 1150, the actual error e' is compared with a defined tolerable error e. In case the error is tolerable, the process continues with step 1160: The chosen synthesis channel number is passed to the synthesis filter bank and the calculated analysis channel number is passed to the analysis filter bank, respectively. If the error is not tolerable, the process continues with step 1110, a new synthesis channel number is chosen and the process is repeated until a suitable analysis and synthesis filter bank channel number has been determined.

Figure 18:
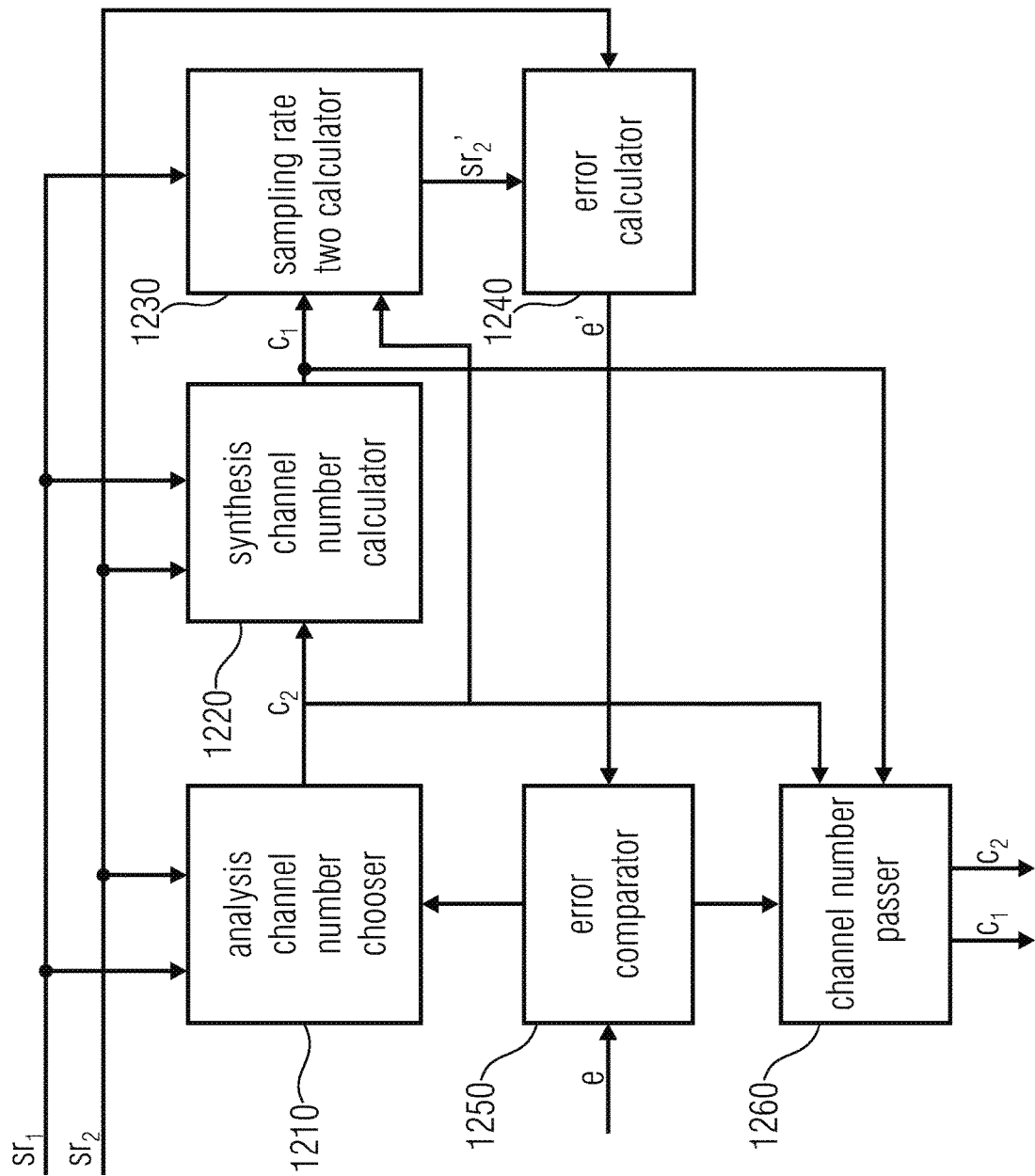
FIG. 18 illustrates a controller according to a further embodiment comprising an error comparator.

FIG. 18 illustrates a controller according to a further embodiment. The embodiment of FIG. 18 differs from the embodiment of FIG. 16 in that the synthesis channel number chooser 1010 is replaced by an analysis channel number chooser 1210 and that the analysis channel number calculator 1020 is replaced by a synthesis channel number calculator 1220. Instead of choosing a synthesis channel number $c_2$, the analysis channel number chooser 1210 chooses an analysis channel number $c_1$. Then, the synthesis channel number calculator 1220 calculates a synthesis channel number $c_2$ according to the formula $c_2 = c_1 \cdot sr_2/sr_1$. The calculated synthesis channel number $c_2$ is then passed to the sampling rate two calculator 1230, which also receives the chosen analysis channel number $c_1$, the first sampling rate $sr_1$ and the desired second sampling rate $sr_2$. Apart from that, the sampling rate two calculator 1230, the error calculator 1240, the error comparator 1250 and the channel number passer 1260 correspond to the sampling rate two calculator 1030, the error calculator 1040, the error comparator 1050 and the channel number passer 1060 of the embodiment of FIG. 16, respectively.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for processing an audio signal to acquire a resultant audio signal, comprising:
   a configurable audio signal processor for processing an input audio signal in accordance with different configuration settings to acquire a processed audio signal, wherein the apparatus is adapted so that different configuration settings result in different sampling rates of the processed audio signal, an analysis filter bank adapted to receive the processed audio signal as an analysis filter bank input signal, the analysis filter bank comprising a first number of analysis filter bank channels, wherein the analysis filter bank is adapted to transform the analysis filter bank input signal from a time-domain to a time-frequency domain, a synthesis filter bank comprising a second number of synthesis filter bank channels to acquire the resultant audio signal, wherein the synthesis filter bank is adapted to conduct a transformation from the time-frequency domain to the time domain to acquire the resultant audio signal, and a controller for controlling the first number of analysis filter bank channels in accordance with a configuration setting provided to the configurable audio signal processor, so that the resultant audio signal output of the synthesis filter bank comprises the predetermined sampling rate or a sampling rate being different from the predetermined sampling rate and being closer to the predetermined sampling rate than a sampling rate of the analysis filter bank input signal, wherein the apparatus is adapted to receive the configuration setting at run time.

2. An apparatus according to claim 1, characterized in that the analysis filter bank is adapted to transform the analysis filter bank input signal being represented in the time-domain into a first time-frequency domain audio signal having a plurality of first subband signals, wherein the number of first subband signals is equal to the first number of analysis filter bank channels, wherein the apparatus further comprises a signal adjuster being adapted to generate a second time-frequency domain audio signal having a plurality of second subband signals from the first time-frequency domain audio signal based on the configuration setting, such that the number of second subband signals of the second time-frequency domain audio signal is equal to the number of synthesis filter bank channels, and wherein the number of second subband signals of the second time-frequency domain audio signal is different from the number of subband signals of the first time-frequency domain audio signal, and wherein the synthesis filter bank is adapted to transform the second time-frequency domain audio signal into a time domain audio signal as the audio signal output of the synthesis filter bank.

3. An apparatus according to claim 2, characterized in that the signal adjuster is adapted to generate the second time-frequency domain audio signal by generating at least one additional subband signal.

4. An apparatus according to claim 3, characterized in that the signal adjuster is adapted to generate at least one additional subband signal by conducting spectral band replication to generate at least one additional subband signal.

5. An apparatus according to claim 3, characterized in that the signal adjuster is adapted to generate a zero signal as additional subband signal.

6. An apparatus according to claim 1, characterized in that the analysis filter bank is a QMF analysis filter bank and wherein the synthesis filter bank is a QMF synthesis filter bank.

7. An apparatus according to claim 1, characterized in that the analysis filter bank is an MDCT analysis filter bank and wherein the synthesis filter bank is an MDCT synthesis filter bank.

8. An apparatus according to claim 1, characterized in that the apparatus furthermore comprises an additional resampler being adapted to resample a synthesis filter bank output signal having a first synthesis sampling rate to output a resampled output signal having a second synthesis sampling rate.

9. An apparatus according to claim 1, characterized in that the apparatus is adapted to feed a synthesis filter bank output signal having a first synthesis sampling rate into an analysis filter bank as an analysis filter bank input signal.

10. An apparatus according to claim 1, characterized in that the controller is adapted to determine the first number of analysis filter bank channels or the second number of synthesis filter bank channels based on a tolerable error.

11. An apparatus according to claim 10, characterized in that the controller comprises an error comparator for comparing the actual error with a tolerable error.

12. A method for processing an audio signal to acquire a resultant audio signal, comprising:

processing an input audio signal in accordance with different configuration settings, to acquire a first processed audio signal, so that different configuration settings result in different sampling rates of the first processed audio signal, inputting the first processed audio signal into an analysis filter bank, and transforming the analysis filter bank input signal from a time-domain to a time-frequency domain, acquiring the resultant audio signal at a synthesis filter bank, wherein the synthesis filter bank conducts a transformation from the time-frequency domain to the time domain to acquire the resultant audio signal, controlling a first number of analysis filter bank channels of the analysis filter bank in accordance with a configuration setting, so that the resultant audio signal output by the synthesis filter bank comprises the predetermined sampling rate or a sampling rate being different from the predetermined sampling rate and being closer to the predetermined sampling rate than the sampling rate of the first processed audio signal, wherein the configuration setting is received at run time.

13. A non-transitory computer-readable medium having stored thereon a computer program for implementing the method of claim 12, when the computer program is executed by a computer or a signal processor.

* * * * *